US008749696B2

(12) United States Patent
Goto

(10) Patent No.: US 8,749,696 B2
(45) Date of Patent: Jun. 10, 2014

(54) IMAGE PICKUP APPARATUS HAVING AN EXIT PUPIL WITH DIVIDED AREAS

(75) Inventor: Hisashi Goto, Tokyo (JP)

(73) Assignee: Olympus Corporation, Tokyo (JP)

( * ) Notice: Subject to any disclaimer, the term of this patent is extended or adjusted under 35 U.S.C. 154(b) by 232 days.

(21) Appl. No.: 13/134,513

(22) Filed: Jun. 8, 2011

(65) Prior Publication Data

US 2011/0310280 A1 Dec. 22, 2011

(30) Foreign Application Priority Data

Jun. 17, 2010 (JP) .................................. 2010-138591

(51) Int. Cl.
*H04N 5/232* (2006.01)
*G03B 13/00* (2006.01)

(52) U.S. Cl.
USPC .......................................................... 348/349

(58) Field of Classification Search
USPC .......................................................... 348/350
See application file for complete search history.

(56) References Cited

U.S. PATENT DOCUMENTS

| 7,924,342 B2 * | 4/2011 | Kusaka .......................... 348/345 |
| 2008/0084483 A1 * | 4/2008 | Kusaka ....................... 348/222.1 |
| 2009/0153720 A1 * | 6/2009 | Suzuki et al. ............. 348/333.01 |
| 2010/0165176 A1 * | 7/2010 | Taniguchi ..................... 348/345 |
| 2011/0019028 A1 * | 1/2011 | Kimijima et al. .......... 348/222.1 |

FOREIGN PATENT DOCUMENTS

| JP | 2000-009990 | 1/2000 |
| JP | 2000-156823 | 6/2000 |
| JP | 2005303409 | * 10/2005 |
| JP | 2007-317951 | 12/2007 |
| JP | 2008-015157 | 1/2008 |
| JP | 2008-040087 | 2/2008 |

OTHER PUBLICATIONS

Japanese Office Action, dated Mar. 5, 2014, issued in corresponding Japanese Patent Application No. 2010-138591.

* cited by examiner

*Primary Examiner* — Albert Cutler
(74) *Attorney, Agent, or Firm* — Kenyon & Kenyon LLP

(57) ABSTRACT

An image pickup element has a plurality of pixels which are arranged two-dimensionally. The plurality of pixels form at least two pixel sets having a first pixel set and a second pixel set. An exit pupil is assumed, and four divided areas which are separated by two straight lines which are mutually orthogonal in a plane which is orthogonal to an optical axis thereof, are set in the exit pupil. Pixels in the first pixel set are arranged to receive a light beam from a first pupil area for which, a center of gravity of area is in one of the four divided areas. For the optical axis, a center of gravity of area of a second pupil area is in a divided area which is symmetrical to a divided area in which the center of gravity of the first pupil area lies. Pixels in the second pixel set are arranged to receive a light beam having a center of gravity of area in the second pupil area. A signal from the first pixel set and a signal from the second pixel set are compared in at least one of directions of the two straight lines, and defocus information is acquired.

9 Claims, 34 Drawing Sheets

|  | F01 | F02 | F03 | F04 | F05 | F06 | F07 | F08 | F09 | F10 | F11 | F12 | F13 | F14 | F15 | F16 |
|---|---|---|---|---|---|---|---|---|---|---|---|---|---|---|---|---|
| L01 | G | R | G | R | G | R | G | R | G | R | G | R | G | R | G | R |
| L02 | B | G | B | G | B | G | B | G | B | G | B | G | B | G | B | G |
| L03 | G | R | G | R | G | R | G | R | G | R | G | R | G | R | G | R |
| L04 | B | G | B | G | B | G | B | G | B | G | B | G | B | G | B | G |
| L05 | G | R | G | R | G | R | G | R | G | R | G | R | G | R | G | R |
| L06 | B | G | B | G | B | G | B | G | B | G | B | G | B | G | B | G |
| L07 | G | R | G | R | G | R | G | R | G | R | G | R | G | R | G | R |
| L08 | B | G | B | G | B | G | B | G | B | G | B | G | B | G | B | G |
| L09 | G | R | G | R | G | R | G | R | G | R | G | R | G | R | G | R |
| L10 | B | G | B | G | B | G | B | G | B | G | B | G | B | G | B | G |
| L11 | G | R | G | R | G | R | G | R | G | R | G | R | G | R | G | R |
| L12 | B | G | B | G | B | G | B | G | B | G | B | G | B | G | B | G |
| L13 | G | R | G | R | G | R | G | R | G | R | G | R | G | R | G | R |
| L14 | B | G | B | G | B | G | B | G | B | G | B | G | B | G | B | G |
| L15 | G | R | G | R | G | R | G | R | G | R | G | R | G | R | G | R |
| L16 | B | G | B | G | B | G | B | G | B | G | B | G | B | G | B | G |

B1 ↑

160 (150)

417

418

IMAGE PICKUP APPARATUS HAVING AN EXIT PUPIL WITH DIVIDED AREAS

CROSS-REFERENCE TO RELATED APPLICATION

The present application is based upon and claims the benefit of priority from the prior Japanese Patent Application No. 2010-138591 filed on Jun. 17, 2010; the entire contents of which are incorporated herein by reference.

BACKGROUND OF THE INVENTION

1. Field of the Invention

The present invention relates to an image pickup apparatus.

2. Description of the Related Art

In a conventional phase-difference AF (auto focus), a phase-difference signal only in one direction could be acquired from a signal from a set of pixel sets. Whereas, it is said to be desirable to acquire a phase-difference signal in two directions for calculating a highly accurate defocus amount, independent of an object.

In Japanese Patent Application Laid-open Publication No. 2000-9990, a structure in which, an optical system for a phase-difference AF is arranged, and a phase-difference signal in two directions is acquired, has been disclosed. In the conventional phase-difference AF having such structure, two sets of pixel sets are disposed, and a phase-difference signal of a different direction is acquired from each pixel set.

Moreover, in Japanese Patent Application Laid-open Publication Nos. 2000-156823 and 2008-40087, a proposal in which a pixel for ranging which outputs a signal is disposed in an image pickup element for acquiring a signal for image formation, has been made.

SUMMARY OF THE INVENTION

An image pickup apparatus according to the present invention, in which, a taking lens is installable or the taking lens is fixed, includes an image pickup element, and the image pickup element has a plurality of pixels which are arranged two-dimensionally, and the plurality of pixels forms at least two pixel sets having a first pixel set and a second pixel set, and an exit pupil is assumed, and four divided areas which are separated by two straight lines which are mutually orthogonal in a plane which is orthogonal to an optical axis thereof, are set in the exit pupil, and the pixels in the first pixel set are arranged to receive a light beam from a first pupil area for which, a center of gravity of area is in one of the four divided areas, and a center of gravity of a second pupil area is in a divided area which is symmetrical, concerning the optical axis, to a divided area in which the center of gravity of the first pupil area lies, and the pixels in the second pixel set are arranged to receive a light beam having a center of gravity of area in the second pupil area, and a signal from the first pixel set and a signal from the second pixel set are compared in at least one of directions of the two straight lines, and defocus information is acquired.

BRIEF DESCRIPTION OF THE DRAWINGS

FIG. 10 is a plan view showing to be overlapped, the arrangement of pixels of the image pickup element and an arrangement of a color filter according to the second modified embodiment of the first embodiment;

DETAILED DESCRIPTION OF THE INVENTION

Figure 1:
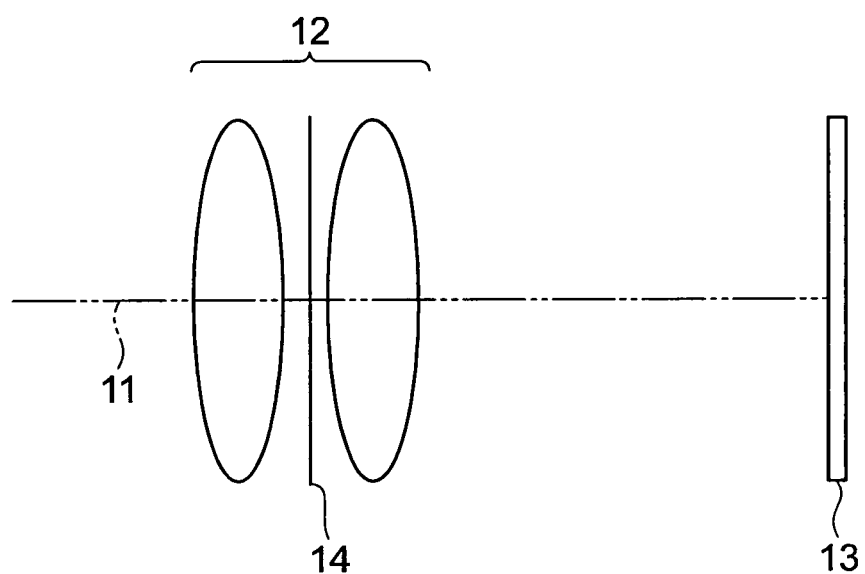
FIG. 1 is a diagram showing a basic structure of an image pickup apparatus.

Exemplary embodiments of an image pickup apparatus according to the present invention will be described below in detail by referring to the accompanying diagrams. However, the present invention is not restricted to the embodiments described below.

Prior to the description of the embodiments, an action and an effect by the image pickup apparatus according to the present invention will be described below.

The image pickup apparatus according to the present invention in which, a taking lens is installable or the taking lens is fixed, includes
an image pickup element, and
the image pickup element has a plurality of pixels which are arranged two-dimensionally, and
the plurality of pixels forms at least two pixel sets having a first pixel set and a second pixel set, and
an exit pupil is assumed, and
four divided areas which are separated by two straight lines which are mutually orthogonal in a plane which is orthogonal to an optical axis thereof, are set in the exit pupil, and
the pixels in the first pixel set are arranged to receive a light beam from a first pupil area for which, a center of gravity of area is in one of the four divided areas, and
a center of gravity of a second pupil area is in a divided area which is symmetrical, concerning the optical axis, to a divided area in which the center of gravity of the first pupil area lies, and
the pixels in the second pixel set are arranged to receive a light beam having a center of gravity in the second pupil area, and
a signal from the first pixel set and a signal from the second pixel set are compared in at least one of directions of the two straight lines, and defocus information is acquired.

According to such arrangement, it is possible to acquire phase-difference information in two directions by light beams from a set of different pupil areas.

In the image pickup apparatus according to the present invention, it is preferable that the first pixel set and the second pixel set are disposed inside the image pickup element for image formation.

Accordingly, since it is possible to acquire the phase-difference information of two directions for one image area, it is possible to have a high accuracy of ranging. Moreover, since it is possible to acquire the phase-difference information of two directions with small number of pixels for ranging, it is possible to have both, an image quality and a ranging accuracy.

In the image pickup apparatus according to the present invention, it is preferable to acquire a signal for image formation from the first pixel set and the second pixel set.

Accordingly, since it is possible to acquire the phase-difference information of two directions by the small number of pixels for ranging, it is possible to dispose practically the pixels for ranging densely, to have a sufficient amount of light. Therefore, it is possible to achieve a signal for image formation.

In the image pickup apparatus according to the present invention, the first pupil area and the second pupil area lie at least in a divided area having a center of gravity of area, and two divided areas which are adjacent to the divided area having the center of gravity of area, and that the first pupil area and the second pupil area have an overlapping portion in the adjacent area.

According to such arrangement, by overlapping a part of the pupil areas without dividing the pupil, it is possible to receive sufficient amount of light. Moreover, by being able to receive sufficient amount of light, it is possible to improve an accuracy of defocus calculation. Furthermore, by disposing the first pixel set and the second pixel set inside the image pickup element for image formation, it is possible to acquire a signal necessary for image formation even from the first pixel set and the second pixel set.

In the image pickup apparatus according to the present invention, it is preferable that the two straight lines are a straight line in a direction horizontal or parallel to one side of the image pickup element, and a straight line in a direction perpendicular to one side of the image pickup element.

According to such arrangement, in a case in which, the horizontal line and the vertical line are the line horizontal to the side of the image pickup element and the line perpendicular to the side of the image pickup element, since it is possible to reduce a practical pixel pitch which is used for calculating the phase difference information, a small-sizing of the image pickup element is possible.

(Basic Structure)

Firstly, a basic structure of divided areas which are to be set in the exit pupil, and a pupil area having a center of gravity in one of the divided areas will be described below.

Figure 2:
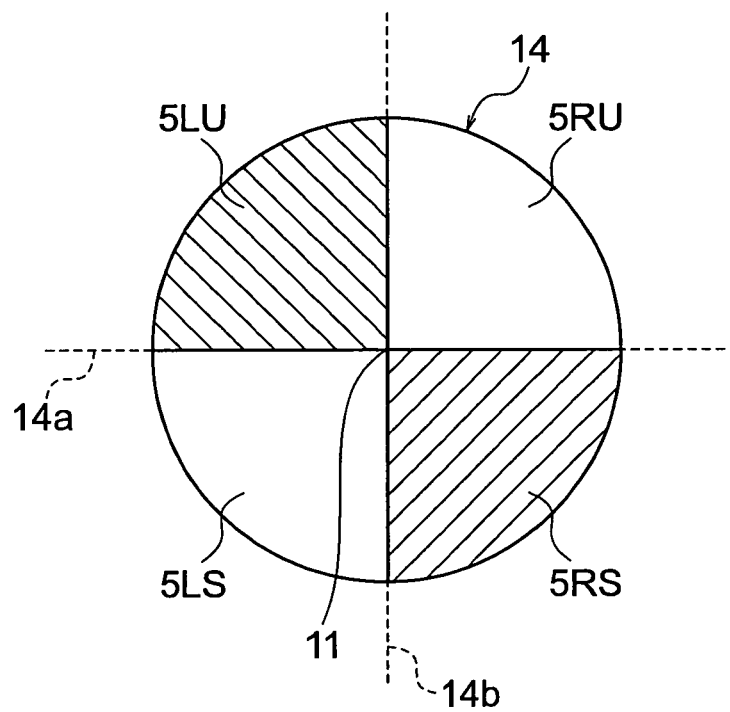
FIG. 2 is a plan view showing a basic structure of a first pupil area and a second pupil area inside an exit pupil which is assumed.
Figure 3:
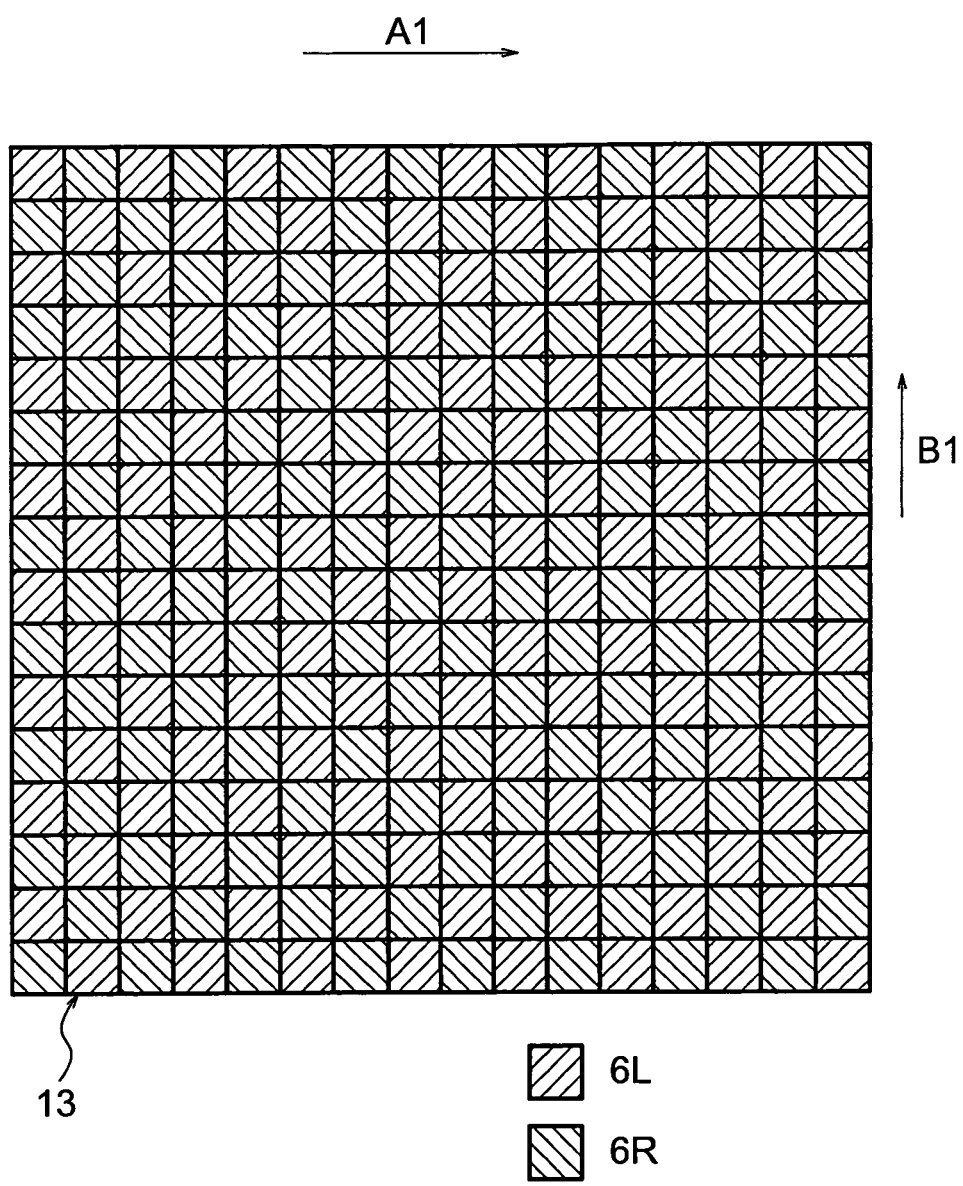
FIG. 3 is a plan view showing an example of an arrangement of pixels of an image pickup element.

FIG. 1 is a diagram showing a basic structure of an image pickup apparatus. FIG. 2 is a plan view in which, a basic structure of a first pupil area and a second pupil area inside an exit pupil 14 which is assumed, is shown. FIG. 3 is a plan view showing an example of an arrangement of pixels of an image pickup element 13.

As shown in FIG. 1, the image pickup element 13 having pixels for detecting defocus is disposed on an optical axis 11 of a taking lens 12. Moreover, the exit pupil 14 is assumed on the optical axis 11. The exit pupil 14, in some cases, is set from a structure of the image pickup element 13 and in some cases, is set from a structure of the taking lens 12.

As shown in FIG. 2, the exit pupil 14 includes four divided areas 5LU, 5RU, 5LS, and 5RS which are separated by a horizontal line 14$a$ and a vertical line 14$b$, with the optical axis 11 as a center. The first pupil area and a center of gravity of the first pupil area are in the divided area 5LU at an upper left side, and the second pupil area and a center of gravity of the second pupil area are in the divided area 5RS at a lower right side (FIG. 2). In other words, the center of gravity of the second pupil area exists in a divided area which is symmetrical, concerning the optical axis, to the divided area in which, the center of gravity of the first pupil area exists.

The horizontal line and the vertical line in this case, are let to be a straight line in a direction horizontal to one side of the image pickup element and a straight line in a direction perpendicular to one side of the image pickup element, in this embodiment. However, these two straight lines are not restricted to the abovementioned straight lines, and may be two straight lines which are mutually orthogonal in a plane which is orthogonal to the optical axis.

Moreover, in an example shown in FIG. 2, for simplifying, the first pupil area is made to coincide with the divided area 5LU at the upper left side, and the second pupil area is made to coincide with the divided area 5RS at the lower right side. However, an arrangement other than the abovementioned arrangement may also be made, without changing the center of gravity of the area. For instance, the first pupil area may be disposed in the three divided areas 5LU, 5RU, and 5LS, and the second pupil area may be disposed in the three divided areas 5RU, 5LS, and 5RS. In this case, the first pupil area and the second pupil area overlap in the divided area 5RU at the upper right side and the divided area 5LS at the lower left side.

The image pickup element 13 has a plurality of pixels which are arranged two-dimensionally in a first direction A1 and a second direction B1 which are mutually orthogonal, in a plane orthogonal to the optical axis 11. In the example of the arrangement of the image pickup element 13 shown in FIG. 3, a plurality of pixels 6L corresponding to the first pupil area and a plurality of pixels 6R corresponding to the second pupil area are disposed in a checkered pattern. The plurality of pixels 6L forms the first pixel set which receives a light beam from the first pupil area, and the plurality of pixels 6R forms the second pixel set which receives a light beam from the second pupil area. Here, the first direction A1 in the image pickup element 13 corresponds to the horizontal line 14$a$, and the second direction B1 in the image pickup element 13 corresponds to the vertical line 14$b$.

The defocus information is acquired by comparing a signal from the first pixel set and a signal from the second pixel set in at least one of the first direction A1 and the second direction B1. For instance, in a case of detecting phase-difference information by comparing the first pixel area and the second pixel area corresponding to the plurality of pixels of the same row, it is preferable to calculate by letting a position at which, the center of gravity of the respective pupil area is projected on the horizontal line, to be the center of gravity of the pupil area. Whereas, in a case of detecting phase difference information by comparing the first pupil area and the second pupil area corresponding to the plurality of pixels of the same column, it is preferable to calculate by letting a position at which, the center of gravity of the respective pupil area is projected on the vertical line, to be the center of gravity of the pupil area.

Here, the first pixel set and the second pixel set are divided by pixel positions of the image pickup element. However, the first pixel set and the second pixel set may also be subjected to time-division.

In the abovementioned conventional image pickup apparatus, when the four pixel sets on a right side, a left side, an upper side, and a lower side are provided, in a case of acquiring the phase-difference information of the first direction (horizontal direction), information from the pixel sets on the left side and the right side is to be used, and in a case of acquiring the phase-difference information of the second direction (vertical direction), information from pixel sets on the lower side and the upper side is to be used. For the conventional image pickup apparatus having such structure, since the number of pixels forming the pixel set of the first embodiment becomes double, it is possible to improve the ranging accuracy.

Moreover, in a case of increasing the number of pixels by time division, in the image pickup apparatus according to the first embodiment, since time exposure double the time exposure for the conventional image pickup apparatus is possible, each time exposure of four times is possible for each pixel set. Accordingly, it is possible to improve the ranging accuracy.

The abovementioned conventional image pickup apparatus has a structure for a single-lens reflex camera and by letting it to be divided into four, an area of the image pickup element increases, which is not preferable.

(First Embodiment)

Figure 4:
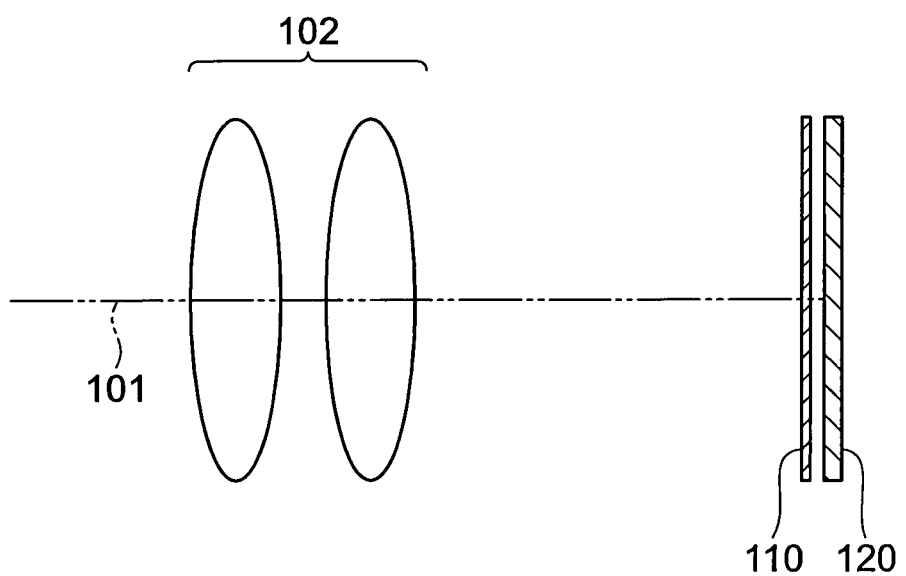
FIG. 4 is a diagram showing a schematic structure of an image pickup apparatus according to a first embodiment of the present invention.
Figure 5:
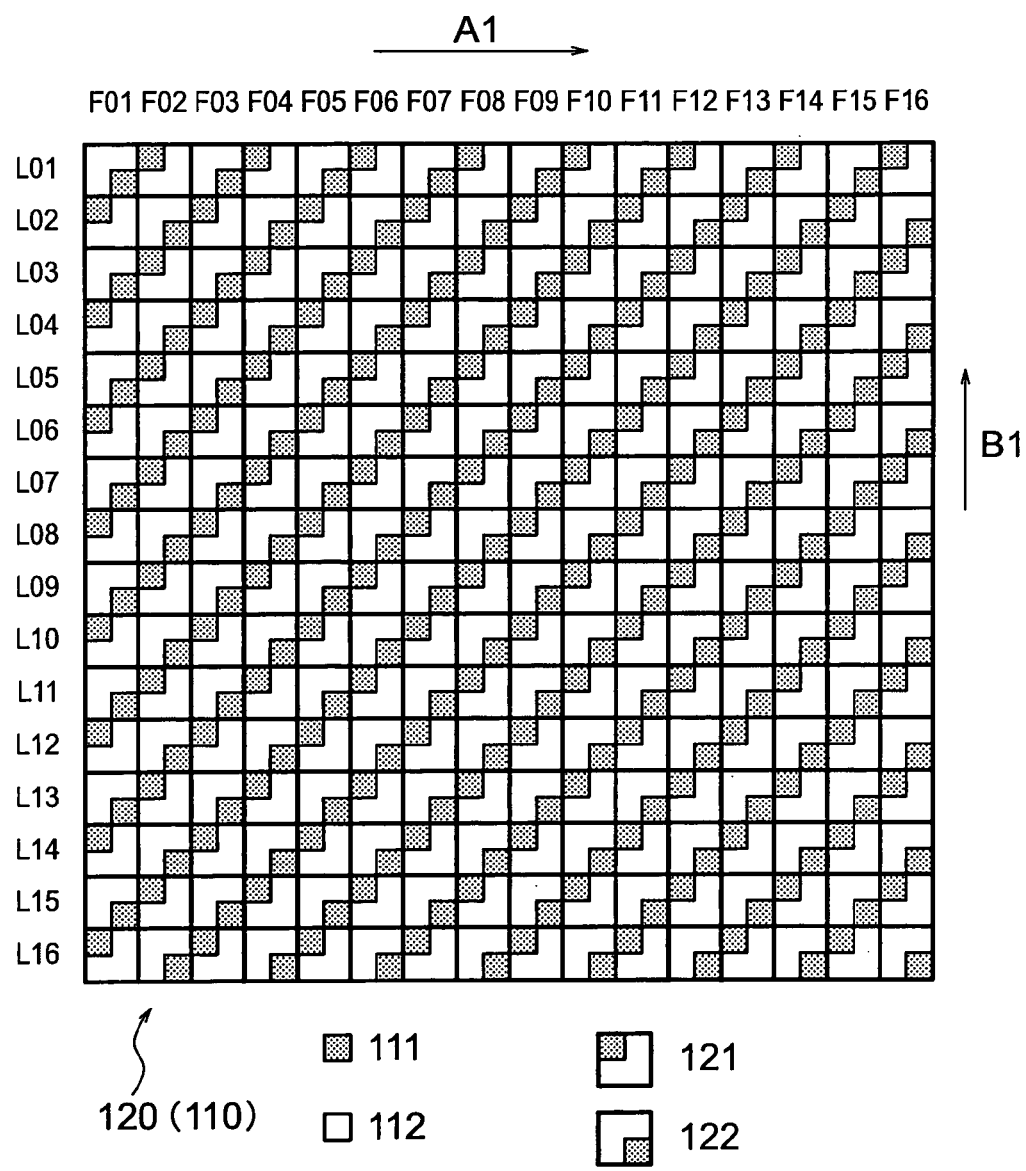
FIG. 5 is a plan view showing to be overlapped, a light shielding area by a light shielding unit, and an arrangement of pixels of an image pickup element in the first embodiment.
Figure 6:
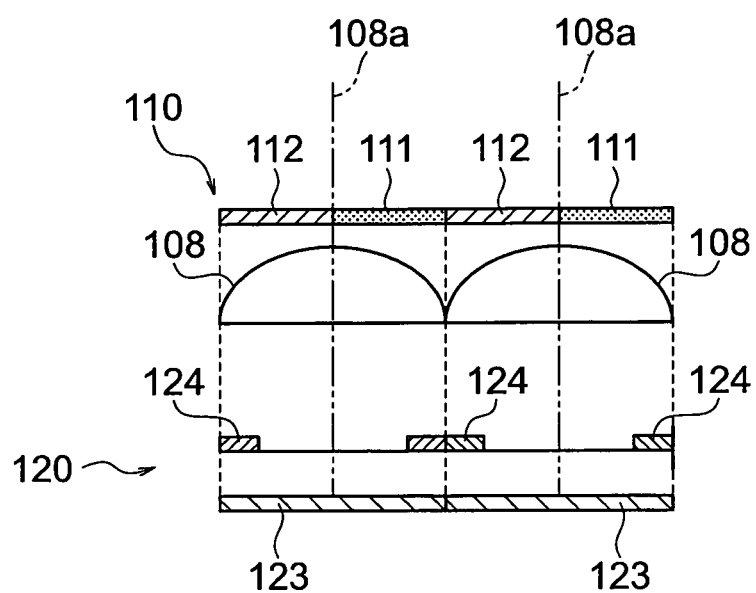
FIG. 6 is a cross-sectional view showing an arrangement of the pixels and the light shielding unit in the first embodiment.

FIG. 4 is a diagram showing a schematic structure of an image pickup apparatus according to the first embodiment of the present invention. FIG. 5 is a plan view showing to be overlapped, a light shielding area 111 by a light shielding unit 110 and an arrangement of pixels of an image pickup element 120 in the first embodiment. FIG. 6 is a cross-sectional view showing an arrangement of the pixels and the light shielding unit 110 in the first embodiment.

As shown in FIG. 4, in the image pickup apparatus according to the first embodiment, the image pickup element 120 having pixels for detecting defocus is disposed on an optical axis 101 of a taking lens 102. As shown in FIG. 5, the image pickup element 120 has a plurality of pixels which are arranged in rows two dimensionally in the first direction A1 and the second direction B1 which are mutually orthogonal. The plurality of pixels includes a photoelectric conversion area of same area, and has a first pixel set 121 and a second pixel set 122 which are disposed in a checkered pattern.

The light shielding unit 110 for assuming an exit pupil is disposed near an object side of the image pickup element 120. The light shielding unit 110 is a unit such as a light shielding filter, and sets for each pixel of the image pickup element 120, four divided areas which are separated by a line corresponding to the first direction A1 of the image pickup element 120, and a line corresponding to the second direction B1 of the image pickup element 120. The light shielding unit 110 includes a light shielding area 111 which shields incident light, and a transparent area 112 which transmits the light incident.

As shown in FIG. 6, an on-chip lens 108 and the light shielding unit 110 are disposed to correspond with a photoelectric conversion surface 123 of each pixel. A light shielding member 124 which regulates the photoelectric conversion area of each photoelectric conversion surface 123 is provided between the photoelectric conversion surface 123 and the on-chip lens 108. The line which divides the transparent area 112 and the light shielding area 111 of the light shielding unit 110 is disposed on an optical axis 108a of the on-chip lens 108. Moreover, the optical axis 108a passes through a center of the photoelectric conversion surface 123 and each pixel.

As shown in FIG. 5, an upper left side of each pixel forming the first pixel set 121 is covered by the light shielding area 111, and a portion of each pixel excluding the upper left side receives light which has transmitted through the transparent area 112 as the first pupil area. Consequently, there exists a center of gravity of the first pupil area at a lower right side of the pixel, which is one of the four divided areas, corresponding to these pixels.

Moreover, a lower right side of each pixel forming the second pixel set 122 is covered by the light shielding area 111, and a portion of each pixel excluding the lower right side receives light which has transmitted through the transparent area 112 as the second pupil area. Consequently, there exists a center of gravity of the second pupil area at an upper left side of the pixel, which is one of the four divided areas, corresponding to these pixels.

In the abovementioned structure, when a signal from the first pixel set 121 and a signal from the second pixel set 122 are compared in a vertical direction (the second direction B1), phase-difference information in which, the exit pupil is divided into an upper part and a lower part, is acquired, and when the signal from the first pixel set 121 and the signal from the second pixel set 122 are compared in a left-right direction (the first direction), phase-difference information in which, the exit pupil is divided into a left part and a right part, is acquired.

For instance, a signal waveform achieved in order of pixels L03 F02, L04 F03, L03 F04, L04 F05, L03 F06, L04 F07, L03 F08, and L04 F09 of the first pixel set 121 is let to be a left-side image, and a signal waveform achieved in order of pixels L04 F02, L03 F03, L04 F04, L03 F05, L04 F06, L03 F07, L04 F08, and L03 F09 of the second pixel set 122 is let to be a right-side image, and a phase-difference between the left-side image and the right-side image is to be calculated from these images. It is possible to find an amount of defocus of a taking lens based on a value of the phase-difference which is calculated.

Here, for indicating a specific pixel, the pixel is expressed by arranging row numbers L01 to L16 and column numbers F01 to F06. For example, from the row of L01, a pixel corresponding to the column F01 is expressed as 'L01 F01'.

Moreover, a signal waveform achieved in order of pixels L04 F03, L05 F02, L06 F03, L07 F02, L08 F03, L09 F02, L10 F03, and L11 F02 of the first pixel set 121 is let to be a lower-side image, and a signal waveform achieved in order of pixels L04 F02, L05 F03, L06 F02, L07 F03, L08 F02, L09 F03, L10 F02, and L11 F03 of the second pixel set 122 is let to be an upper-side image, and a phase-difference between the upper-side image and the lower-side image is to be calculated from these images. It is possible to find the amount of defocus of the taking lens based on a value of the phase-difference which is calculated.

A light dimming unit may be used instead of the light shielding unit 110. As the light attenuating unit, a structure same as a so-called ND (neutral density) filter may be used. When the structure is a light absorbing filter in particular, flare due to reflection does not occur, and therefore it is preferable.

Moreover, when the light attenuating unit is used, an amount of light that can be received by pixels increases, which is advantageous for image formation, and an image quality improves. Furthermore, since the increase in the amount of light improves an accuracy of calculating an amount phase-difference, it is possible to calculate an amount of defocus with high accuracy.

Figure 7:
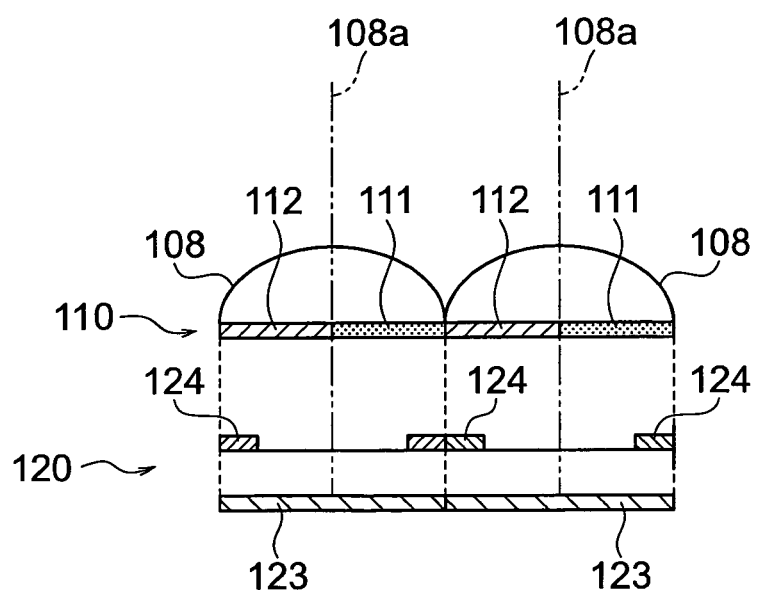
FIG. 7 is a cross-sectional view showing an arrangement of pixels and a light shielding unit in a first modified embodiment of the first embodiment.

The light shielding unit 110 according to the first embodiment, as shown in FIG. 6, has been disposed on an object side near the on-chip lens 108 of the pixel. Instead of such arrangement, the light shielding unit 110 may be disposed toward the photoelectric conversion surface 123 near the on-chip lens 108 of the pixel as shown in FIG. 7. Here, FIG. 7 is a cross-sectional view showing an arrangement of pixels and a light shielding unit in a first modified embodiment of the first embodiment.

The light shielding area is not restricted to an area on the upper left side or the lower right side equivalent to one fourth of a pixel, as the light shielding area 111 shown in FIG. 5. In this case, it is preferable that a center of gravity of area of an amount of incident light is not on a line in a direction of detection of phase difference which passes through a central line of the pixel. For instance, it is preferable to have the light shielding area up to a portion surrounding any of the upper right side, the upper left side, the lower right side, and the lower left side from a center of the pixel.

Figure 8A:
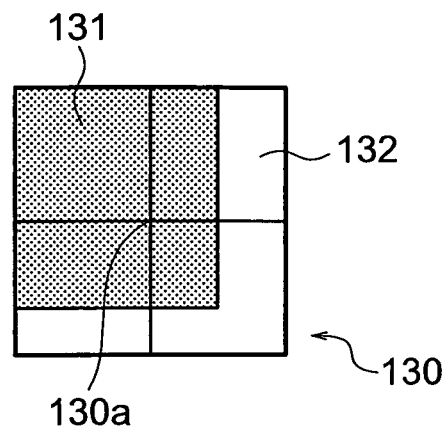
FIG. 8A, FIG. 8B, and FIG. 8C are plan views showing an example of an arrangement of a light shielding portion and a transparent portion in pixels as an example for comparison.
Figure 8B:
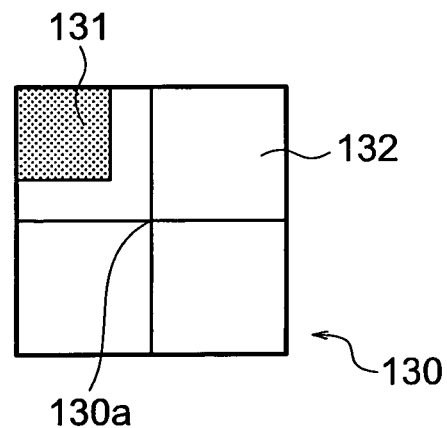

Whereas, as shown in FIG. 8A, when a light shielding portion 131 is spread beyond a center 130a of a pixel 130, as a transparent portion 132 becomes small, an amount of light received by the pixel decreases. Moreover, as shown in FIG. 8B, when a surrounding portion is let to be the transparent portion 132 leaving the center 130a of the pixel 130, the accuracy of detecting the defocus is degraded. Furthermore, as show in FIG. 8C, when the transparent portion 132 is let to be only the surrounding portion of the pixel, detection of defocus when an F value of the taking lens is increased, becomes difficult.

Figure 8C:
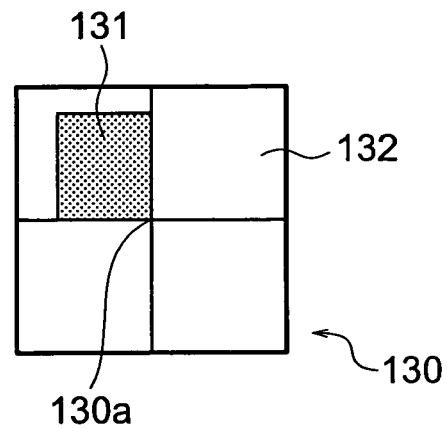

Here, FIG. 8A, FIG. 8B, and FIG. 8C are plan views showing an example of an arrangement of the light shielding portion 131 and the transparent portion 132 in the pixel 130 as an example for comparison.

Figure 9:
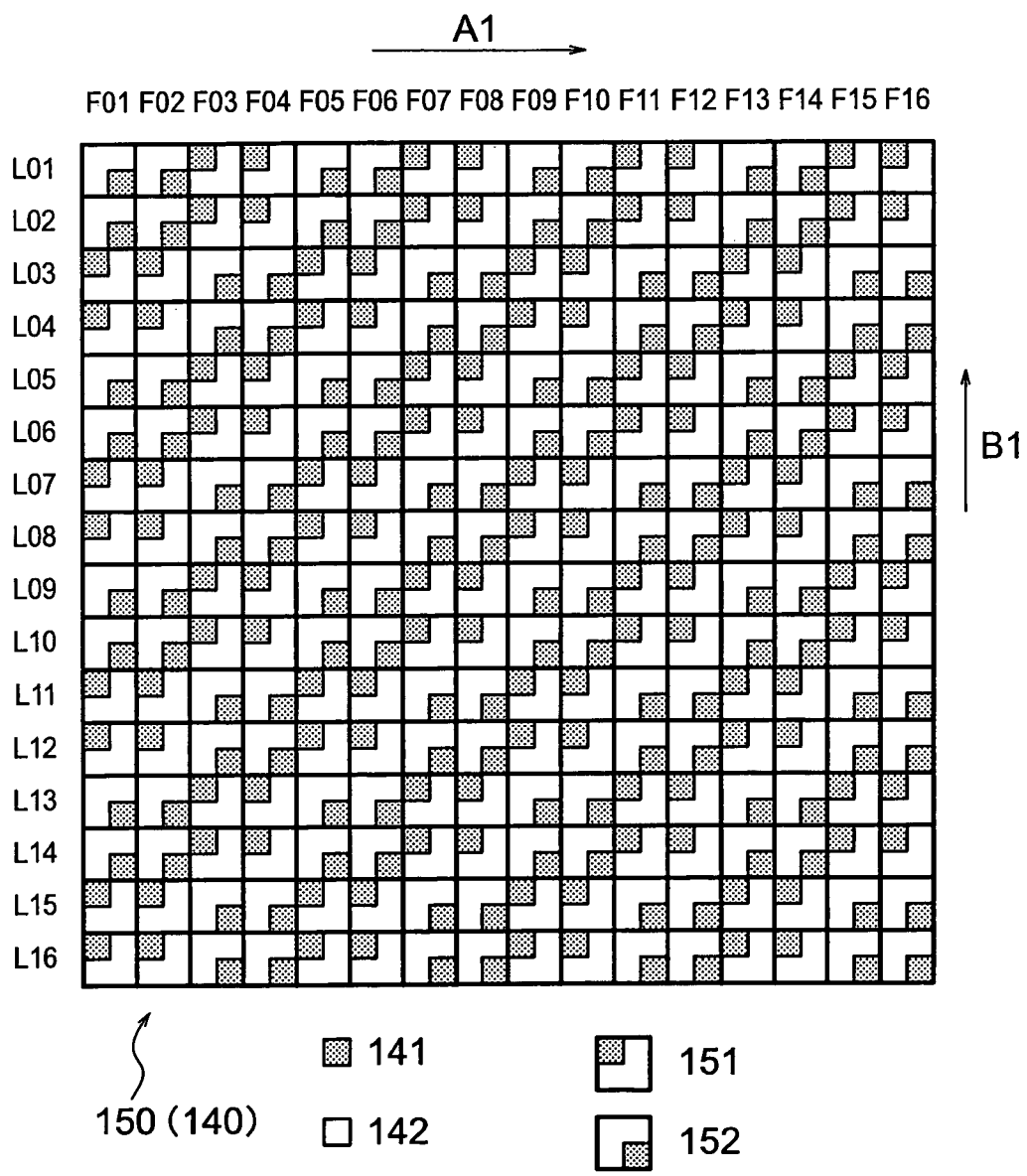
FIG. 9 is a plan view showing to be overlapped, a light shielding area of a light shielding unit, and an arrangement of pixels of an image pickup element according to a second modified embodiment of the first embodiment.
Figure 11:
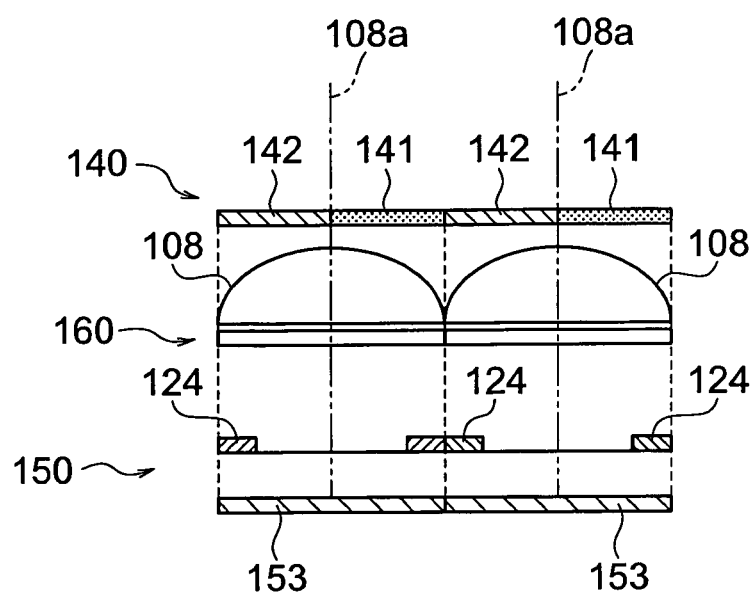
FIG. 11 is a cross-sectional view of the pixels, the light shielding unit, and the color filter according to the second modified embodiment of the first embodiment.

FIG. 9 is a plan view showing to be overlapped, a light shielding area 141 by a light shielding unit 140 and an arrangement of pixels of an image pickup element 150 according to a second modified embodiment of the first embodiment. FIG. 10 is a plan view showing to be overlapped, the arrangement of pixels of the image pickup element 150 and an arrangement of a color filter 160 according to the second modified embodiment of the first embodiment. FIG. 11 is a cross-sectional view showing an arrangement of pixels, a light shielding unit, and a color filter according to the second modified embodiment of the first embodiment. Same reference numerals are assigned to members which are similar as in the first embodiment, and description in detail of such members is omitted.

In the image pickup apparatus according to the second modified embodiment of the first embodiment, an arrangement is made such that a color image can be acquired by using the color filter 160. The image pickup element 150 according to the second modified embodiment of the first embodiment, similarly as the image pickup element 120 according to the first embodiment, has a plurality of pixels which are arranged two-dimensionally in the first direction A1 and the second direction B1 which are mutually orthogonal.

The color filter 160 has R (red), G (green), and B (blue) disposed at positions corresponding to each pixel of the image pickup element 150. Concretely, a pixel L01 F01 is let to be a filter G of green color, a pixel L01 F02 is let to be a filter R of red color, a pixel L02 F01 is let to be a filter B of blue color, and a pixel L02 F02 is let to be the filter G of green color, and this combination pattern of 2×2 is repeated in a horizontal direction and a vertical direction.

The plurality of pixels of the image pickup element 150 has a first pixel set 151 and a second pixel set 152. An arrangement of a light shielding area 141 and a transparent area 142, and a center of gravity of a pupil area in each pixel set are similar as in the first pixel set 121 and the second pixel set 122 according to the first embodiment.

For four pixels which form the combination pattern of 2×2 of the abovementioned color filter 160, pixel set of the same type is to be set, and for an adjacent combination pattern, pixels set of different type is to be set. For example, four pixels L01 F01, L01 F02, L02 F01, and L02 F02 are the first pixel set 151 and pixels on right thereof, L01 F03, L01 F04, L02 F03, and L02 F04 are the second pixel set 152.

As shown in FIG. 11, the light shielding unit 140 is disposed on the object side near the on-chip lens 108 of the pixel, and the color filter 160 is disposed nearby a photoelectric conversion surface of the on-chip lens 108. A line which divides the light shielding area 141 and the transparent area 142 of the light shielding unit 140 is disposed on the optical axis 108a of the on-chip lens 108.

Figure 12:
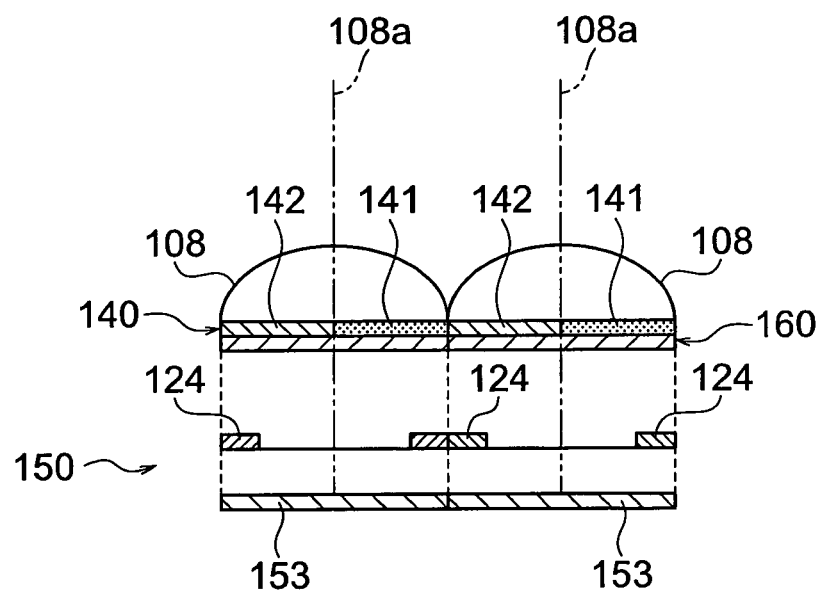
FIG. 12 is a cross-sectional view of pixels, a light shielding unit, and a color filter according to a third modified embodiment of the first embodiment.

FIG. 12 is a cross-sectional view of pixels, a light shielding unit, and a color filter according to a third modified embodiment of the first embodiment. Same reference numerals are assigned to members which are similar as in the first embodiment or the second modified embodiment of the first embodiment, and the description in detail of such members is omitted.

FIG. 12 is a diagram in which, another example of a positional relationship of the light shielding unit 140 and the color filter 160 is shown, and the light shielding unit 140 and the color filter 160 are disposed in order on a side of the photoelectric conversion surface 153 near the on-chip lens 108 of the pixel. By making such an arrangement, it is possible to reduce an effect of cross-talk between the pixels. The order of the light shielding unit 140 and the color filter 160 may be reversed. By making such an arrangement, it is possible to acquire a color image.

(Second Embodiment)

Figure 13:
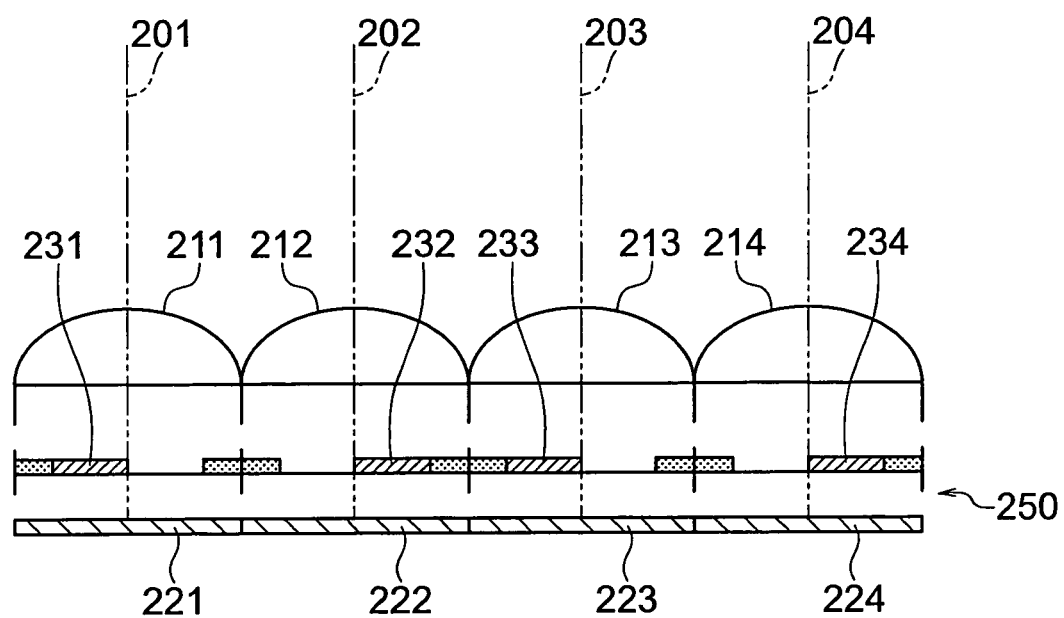
FIG. 13 is a cross-sectional view showing an arrangement of a light shielding unit and pixels according to a second embodiment of the present invention.
Figure 14:
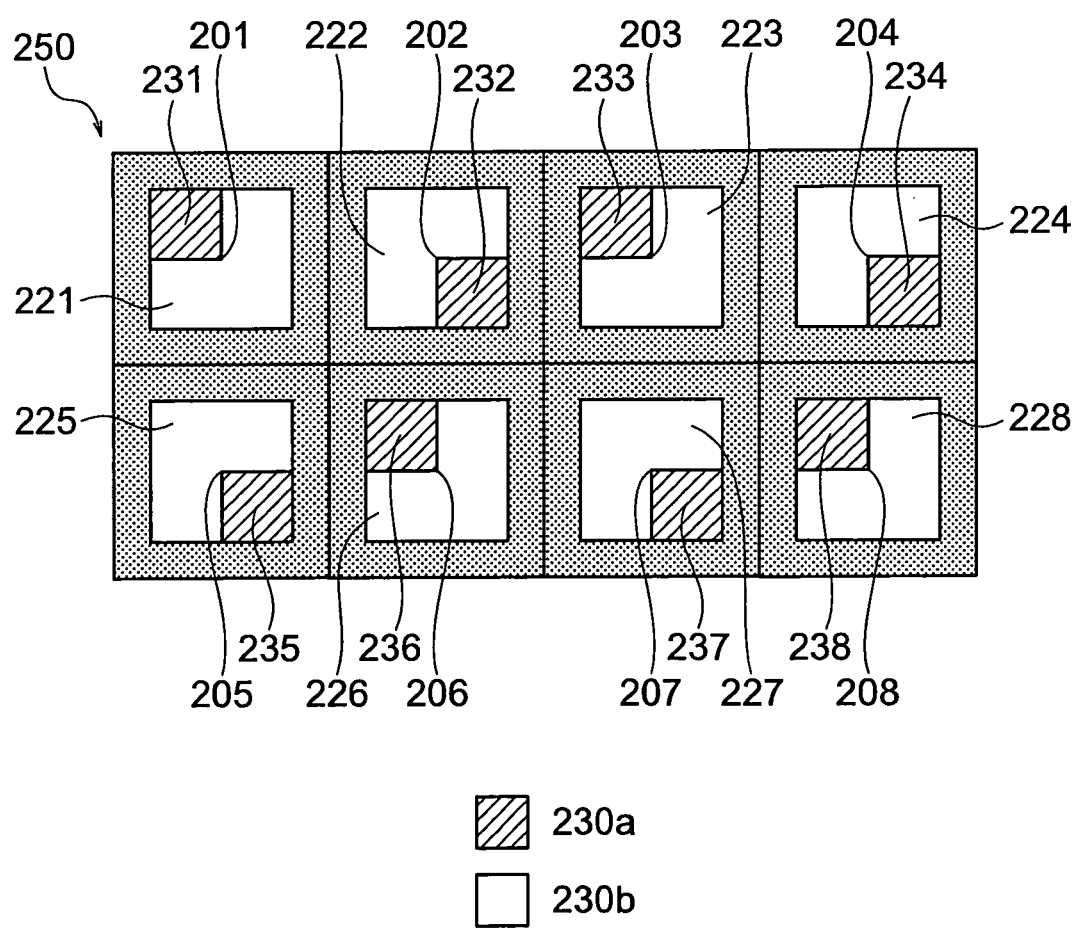
FIG. 14 is a plan view when the pixels shown in FIG. 13 are seen from a direction of an optical axis.
Figure 15:
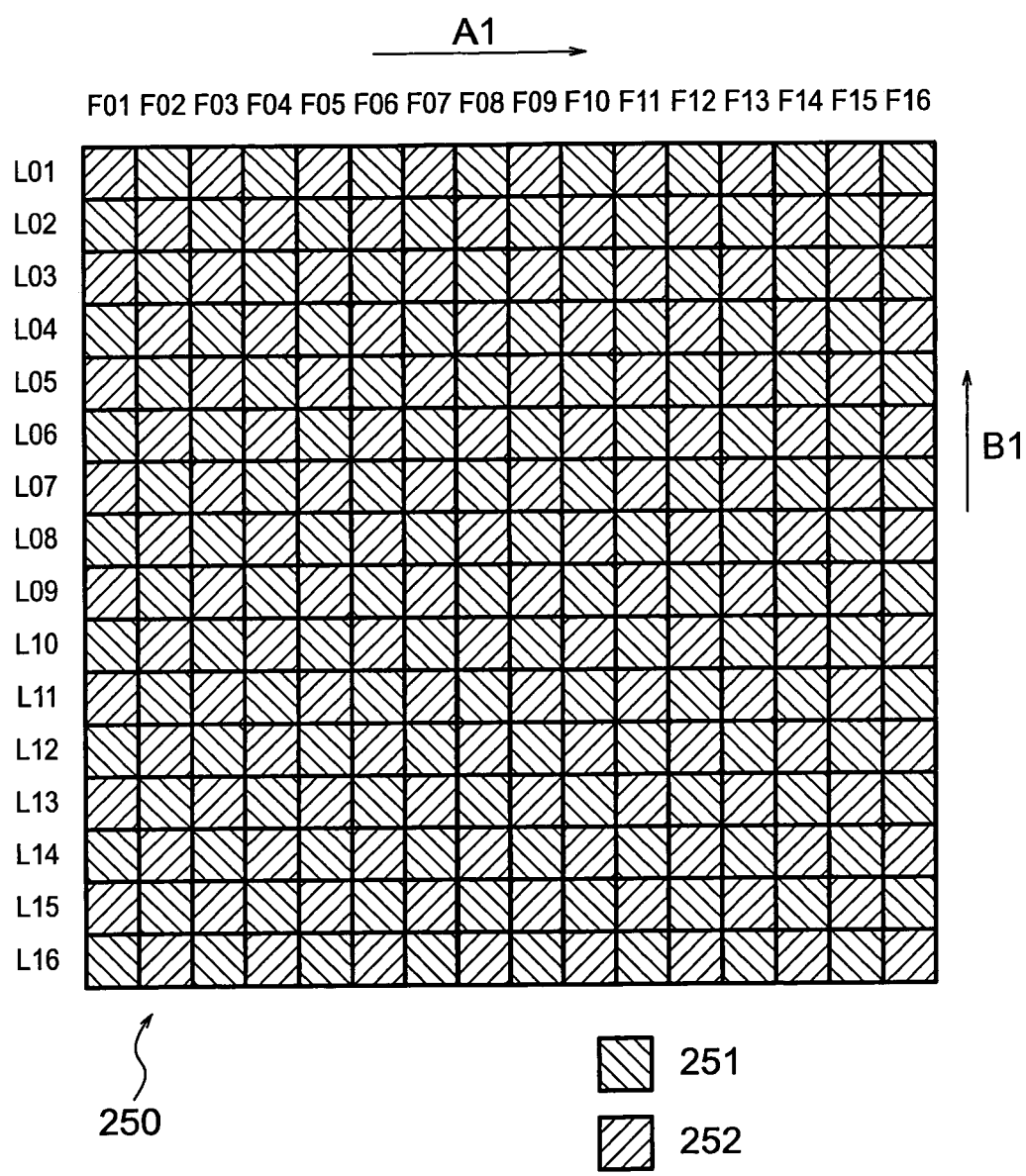
FIG. 15 is a plan view showing an arrangement of pixels of an image pickup apparatus according to the second embodiment.

FIG. 13 is a cross-sectional view showing an arrangement of a light shielding unit and pixels according to a second embodiment of the present invention. FIG. 14 is a plan view when the pixels shown in FIG. 13 are seen from a direction of an optical axis. FIG. 15 is a plan view showing an arrangement of pixels of an image pickup element 250 according to the second embodiment. Here, FIG. 13 corresponds to an equivalent of one row of eight pixels in FIG. 14. In FIG. 14, micro lens is omitted.

FIG. 13 is a schematic diagram of a cross-section of pixels which are aligned. In FIG. 13, an area of the photoelectric conversion area is same, and a distance of respective positions of center of gravity and a distance of pixel pitch are different.

In the image pickup apparatus according to the first embodiment, the first pupil area and the second pupil area have been formed by disposing the light shielding unit 110 near the on-chip lens 108 of the image pickup element 120. In the second embodiment, the first pupil area and the second pupil area have been formed by disposing the light shielding unit near the photoelectric conversion area of the image pickup element 250.

A pixel is divided into four, and in this diagram, an upper left side or a lower right side is let to be a light shielding member or an ND filter.

In FIG. 13 and FIG. 14, micro lenses 211, 212, 213, and 214 are arranged to correspond with respective pixels of the image pickup element 250 (sensor). A distance between the micro lenses 211, 212, 213, and 214 is according to a pixel pitch. However, the micro lenses 211, 212, 213, and 214 may be disposed at an interval narrower than the pixel pitch directed toward surrounding from a center, taking into consideration a position of the exit pupil of the taking lens. Although it is not shown in FIG. 13, but a relationship of the pixels and the corresponding micro lenses is also similar.

Pixels shown in FIG. 14 include photoelectric conversion surfaces 221, 222, 223, 224, 225, 226, 227, and 228 respectively. In each of the respective pixels, each of light shielding members 231, 232, 233, 234, 235, 236, 237, and 238 (light shielding units) respectively is disposed between the micro lens and the photoelectric conversion surface, and near the photoelectric conversion surface. The light shielding members are members such as light shielding filters, and for each pixel of the image pickup element, four divided areas respectively, separated by a line corresponding to a first direction A1 of the image pickup element 250 and a line corresponding to a second direction B1, are to be set. Moreover, the light shielding member includes a light shielding area 230a which shields incident light, and a light transparent area 230b which transmits incident light.

In FIG. 13, the light shielding members 231, 232, 233, 234, 235, 236, 237, and 238 are arranged on the same plane. However, the light shielding members 231, 232, 233, 234, 235, 236, 237, and 238 may not be arranged on the same plane in the same pixel.

The photoelectric conversion area of each pixel is determined by a relationship of the photoelectric conversion surface, the light shielding member, the taking lens that is assumed, and the corresponding micro lens.

Micro lenses are disposed such that respective optical axes 201, 202, 203, 204, 205, 206, 207, and 208 thereof pass through a pixel center of the corresponding pixel.

The image pickup element 250 has a plurality of pixels which are arranged two-dimensionally in the first direction A1 and the second direction B1 which are mutually orthogonal. The plurality of pixels includes the photoelectric conversion area having the same area, and has a first pixel set 251 and a second pixel set 252 which are disposed in a checkered pattern.

Pixels which form the first pixel set 251, in the photoelectric conversion area, are covered by the light shielding area 230a at the upper left side of the pixel, and a portion of the pixel excluding the upper left side receives light which has transmitted through the light transparent area 230b as the first pupil area. Consequently, in the pixels in the first pixel set 251, there exists a center of gravity of the first pupil area at the lower left side of the pixel, which is one of the four divided areas. Here, in FIG. 14, pixels which form the first pixel set are pixels having the photoelectric conversion surfaces 221, 223, 226, and 228.

Moreover, pixels which form the second pixel set 252, in the photoelectric conversion area, are covered by light shielding area 230a at the lower right side of the pixel, and a portion of the pixel excluding the lower right side receives light which has transmitted through the light transparent area 230b as the second pupil area. Consequently, in the pixels in the second pixel set 252, there exists a center of gravity of the second pupil area at the upper left side of the pixel, which is one of the four divided areas. Here, in FIG. 14, pixels which form the second pixel set are pixels having the photoelectric conversion surfaces 222, 224, 225, and 227.

By making the abovementioned arrangement, when a signal from the first pixel set 251 and a signal from the second pixel set 252 are compared in the vertical direction, phase-difference information in which the exit pupil is divided into an upper portion and a lower portion is acquired, and when the signal from the first pixel set 251 and the signal from the second pixel set 252 are compared in the left-right direction, phase-difference information in which the exit pupil is divided into a left-side portion and a right-side portion is acquired. For example, a signal waveform achieved in order of pixels L03 F02, L04 F03, L03 F04, L04 F05, L03 F06, L04 F07, L03 F08, and L04 F09 of the first pixel set is let to be a left-side image, and a signal waveform achieved in order of pixels L04 F02, L03 F03, L04 F04, L03 F05, L04 F06, L03 F07, L04 F08, and L03 F09 of the second pixel set is let to be a right-side image, and a phase-difference between the left-side image and the right-side image is to be calculated from these images. It is possible to find an amount of defocus of the taking lens based on a value of the phase-difference which is calculated.

Moreover, a signal waveform achieved in order of pixels L04 F03, L05 F02, L06 F03, L07 F02, L08 F03, L09 F02, L10 F03, and L11 F02 of the first pixel set is let to be a lower-side image, and a signal waveform achieved in order of pixels L04 F02, L05 F03, L06 F02, L07 F03, L08 F02, L09 F03, L10 F02, and L11 F03 of the second pixel set is let to be an upper-side image, and a phase difference between the upper side image and the lower side image is to be calculated from these images. It is possible to find the amount of defocus of the taking lens based on a value of the phase difference which is calculated.

Even in the second embodiment, by disposing the first pixel set and the second pixel set as shown in FIG. 9, and using a color filter shown in FIG. 10, it is possible to achieve a color image by a similar concept as in the case of the first embodiment.

The rest of the structure, action, and effect are same as in the first embodiment.

(Third Embodiment)

Figure 16:
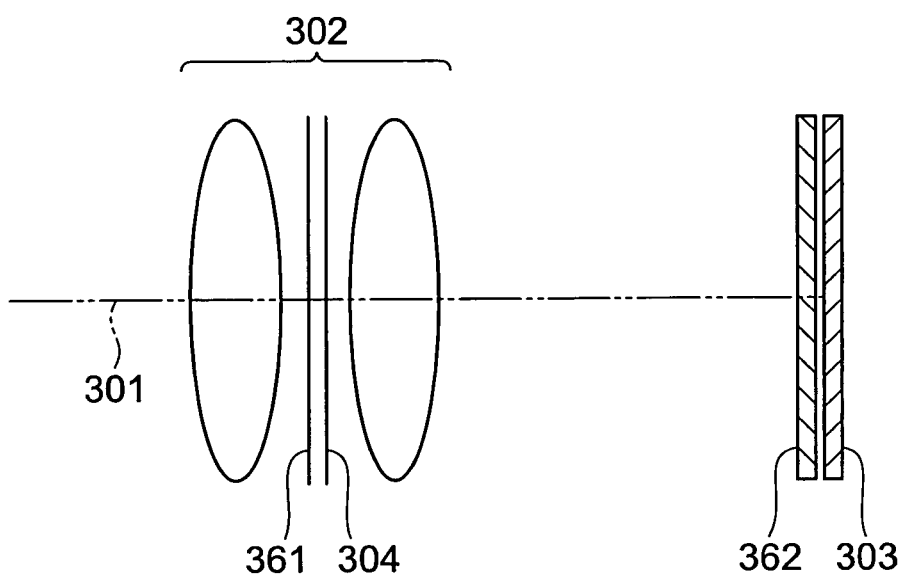
FIG. 16 is a diagram showing a schematic structure of an image pickup apparatus according to a third embodiment of the present invention.
Figure 17:
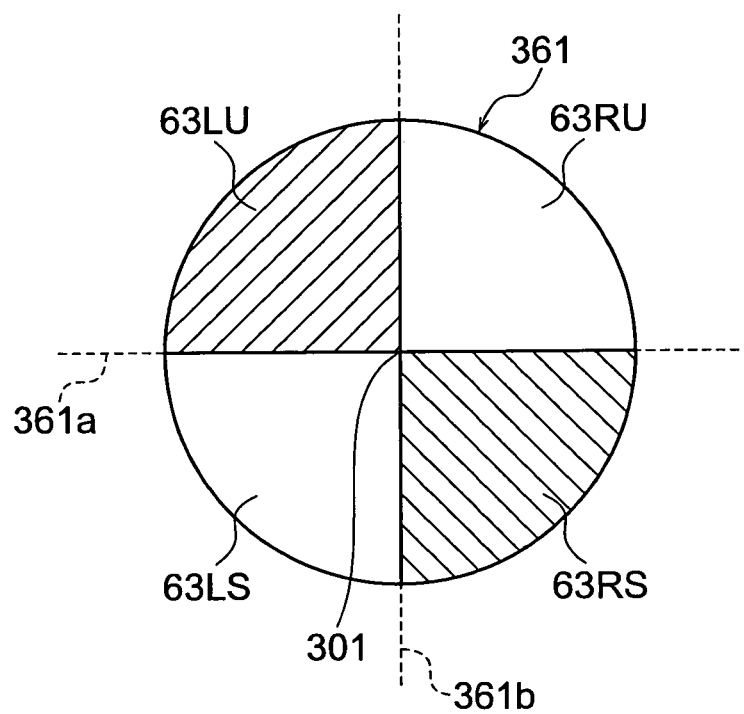
FIG. 17 is a plan view in which, a relationship of a first light shielding unit, and a first pupil area and a second pupil area inside an exit pupil which is assumed, according to the third embodiment, is shown.
Figure 18:
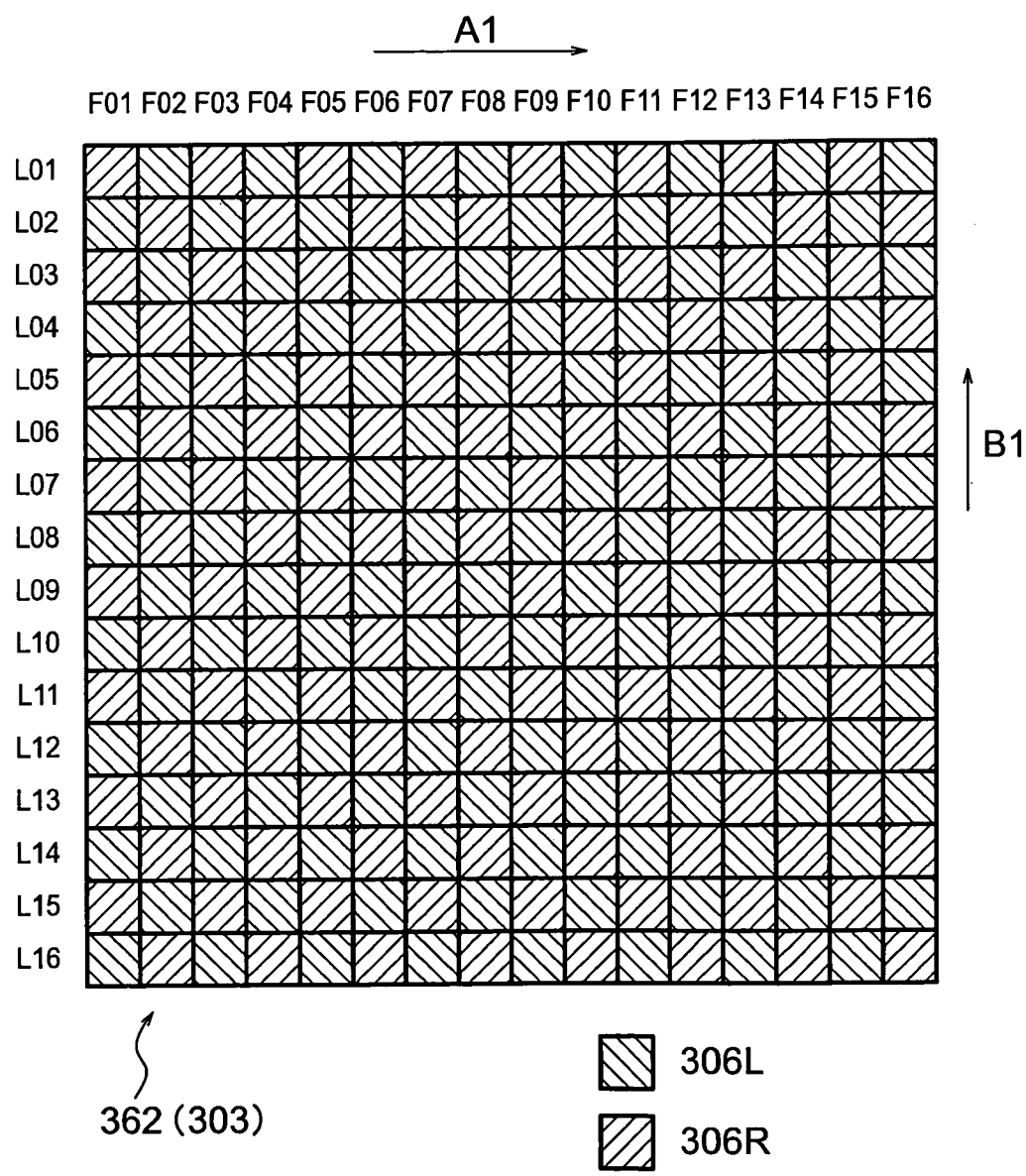
FIG. 18 is a plan view showing to be overlapped, a second light shielding unit and pixels of an image pickup element according to the third embodiment.

FIG. 16 is a diagram showing a schematic structure of an image pickup apparatus according to a third embodiment of the present invention. FIG. 17 is a plan view in which, a relationship of a first light shielding unit 361, and a first pupil area and a second pupil area inside an exit pupil 14 which is assumed is shown. FIG. 18 is a plan view showing to be overlapped, a second light shielding unit 362 and pixels of an image pickup element 303 according to the third embodiment. Moreover, FIG. 18 is a diagram in which, the second light shielding unit 362 and the image pickup element 303 are seen in an optical axial direction.

As shown in FIG. 16, the image pickup element 303 having pixels for detecting defocus is disposed on an optical axis 301 of a taking lens system 302. Moreover, the taking lens system 302 has an aperture stop 304, and the first light shielding unit 361 which is disposed near the aperture stop 304. Furthermore, the second light shielding unit 362 is disposed near the object side of the taking lens system 303.

It is desirable that the first light shielding unit 361 is disposed near the aperture stop 304 in the taking lens system 303. However, the position of the first light shielding unit 361 is not restricted to a position near the aperture stop 304, and the first light shielding unit 361 may be disposed at a position at a predetermined distance from the image pickup element 303, or in other words, a position corresponding to the exit pupil assumed in the image pickup apparatus.

As shown in FIG. 17, the first light shielding unit 361 includes four polarization areas (divided areas) namely, a first polarization area 63LU, 63RU, a second polarization area 63RS, and 63LS which are separated by a horizontal line 361a and a perpendicular line 361b with the optical axis 301 as a center. The first polarization area 63LU at an upper left side corresponds to the first pupil area and a center of gravity of the first pupil area, and the second polarization area 63RS at a lower left side corresponds to the second pupil area and a center of gravity of the second pupil area. An arrangement is such that the first polarization area 63LU at the upper left side and the second polarization area 63RS at the lower right side attenuates or shields a light beam in a direction of polarization differing by 90 degrees, and concerning the optical axis 301, a the center of gravity of the second pupil area exists in a divided area which is symmetrical to the divided area in which, the center of gravity of the first pupil area lies.

Figure 19:
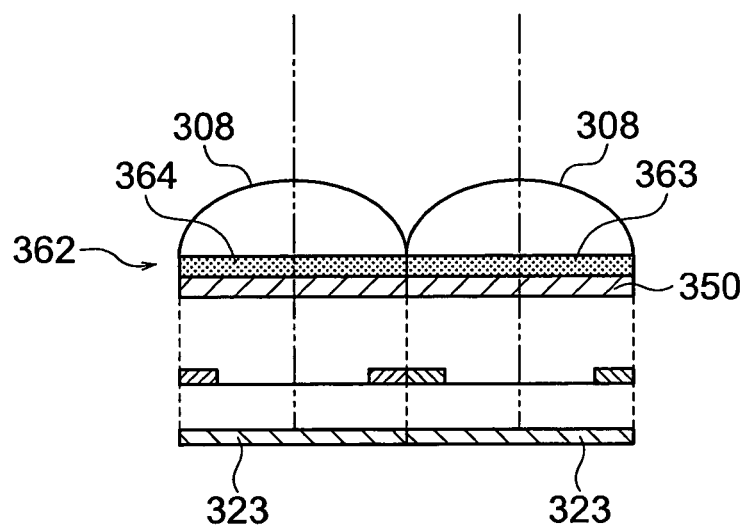
FIG. 19 is a cross-sectional view showing an arrangement of the second light shielding unit and pixels according to the third embodiment.

The second shielding unit 362 also has a similar structure as the first shielding unit 361. In other words, the second shielding unit 362 includes four polarization areas (divided areas), and a first polarization area 363 which is one of the polarization areas (FIG. 19), corresponds to the first pupil area and the center of gravity of the first pupil area, and a second polarization area 364 at a position symmetrical about the optical axis 301 (FIG. 19) corresponds to the second pupil area and the center of gravity of the second pupil area. Here, FIG. 19 is a cross-sectional view showing an arrangement of the second light shielding unit 362 and the pixels according to the third embodiment.

A direction of polarization of a light beam which is attenuated or shielded in the polarization area of the first light shielding unit 361 and a direction of polarization of a light beam which is attenuated or shielded in the polarization area of the second light shielding unit 362 differ mutually by 90 degrees. For example, in a case of shielding an S-polarized light in the polarization area of the first light shielding unit 361, a P-polarized light is shielded in the polarization area of the second light shielding unit 362.

As shown in FIG. 18, the image pickup element 303 has a plurality of pixels arranged two-dimensionally in the first direction A1 and the second direction B1 which are mutually orthogonal. The plurality of pixels includes a photoelectric conversion area having the same area, and has a first pixel set 306L and a second pixel set 306R disposed in a checkered pattern. Moreover, an arrangement is made such that the first polarization area 63LS and the second polarization area 63RS correspond to the pixels of the first pixel set 306L and the pixels of the second pixel set 306R on the image pickup element 303.

The first light shielding unit 361 and the second light shielding unit 362 are disposed such that, the light shielding area and the transparent area are in a checkered pattern corresponding to the pixels of the image pickup element 303 (FIG. 18). A light shielding area of a first polarization unit and a light shielding area of a second polarization unit are arranged to shield light beams in the same direction of polarization.

By making such an arrangement, when a signal from the first pixel set 306L and a signal from the second pixel set 306R are compared in the vertical direction, phase-difference information in which the exit pupil is divided into an upper portion and a lower portion is achieved, and when the signal from the first pixel set 360L and the signal from the second pixel set 306R are compared in the left-right direction, phase-difference information in which the exit pupil is divided into a left-side portion and a right-side portion is achieved.

For example, a signal waveform achieved in order of pixels L03 F02, L04 F03, L03 F04, L04 F05, L03 F06, L04 F07, L03 F08, and L04 F09 of the first pixel set 306L is let to be a left-side image, and a signal waveform achieved in order of pixels L04 F02, L03 F03, L04 F04, L03 F05, L04 F06, L03 F07, L04 F08, and L03 F09 of the second pixel set 306R is let to be a right-side image, and a phase difference between the left-side image and the right-side image is to be calculated from these images. It is possible to find an amount of defocus of the taking lens based on a value of the phase-difference which is calculated.

Moreover, a signal waveform achieved in order of pixels L04 F03, L05 F02, L06 F03, L07 F02, L08 F03, L09 F02, L10 F03, and L11 F02 of the first pixel set 306L is let to be a lower-side image, and a signal waveform achieved in order of pixels L04 F02, L05 F03, L06 F02, L07 F03, L08 F02, L09 F03, L10 F02, and L11 F03 of the second pixel set 306R is let to be an upper-side image, and a phase difference between the upper side image and the lower side image is to be calculated from these images. It is possible to find the amount of defocus of the taking lens based on a value of the phase difference which is calculated.

Moreover, even in the third embodiment, by disposing the first pixel set and the second pixel set as shown in FIG. 9, and using the color filter shown in FIG. 10, it is possible to achieve a color image by a similar concept as in the case of the first embodiment. For achieving the color image, it is preferable to dispose the second light shielding unit 362 and the image pickup element 303 as shown in FIG. 19. The first polarization area 363 or the second polarization area 364 of the light shielding unit 362 is disposed nearby a photoelectric conversion portion 323 of an on-chip lens 308, and a color filter 350 is disposed nearby the photoelectric conversion portion 323. The second light shielding unit 362 may be disposed near the object side of the on-chip lens 308.

The rest of the structure, action, and effect are similar as in the first embodiment.

(Fourth Embodiment)

Figure 20:
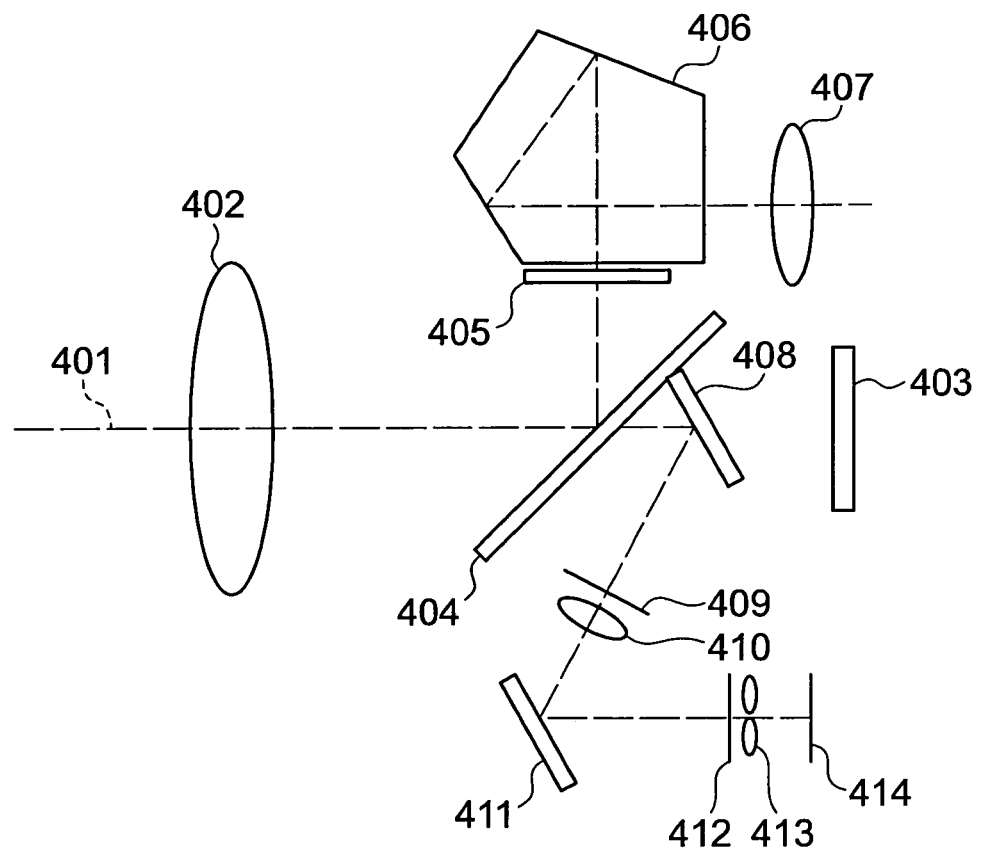
FIG. 20 is a conceptual diagram showing a structure of a single-lens reflex camera according to a fourth embodiment of the present invention.
Figure 21:
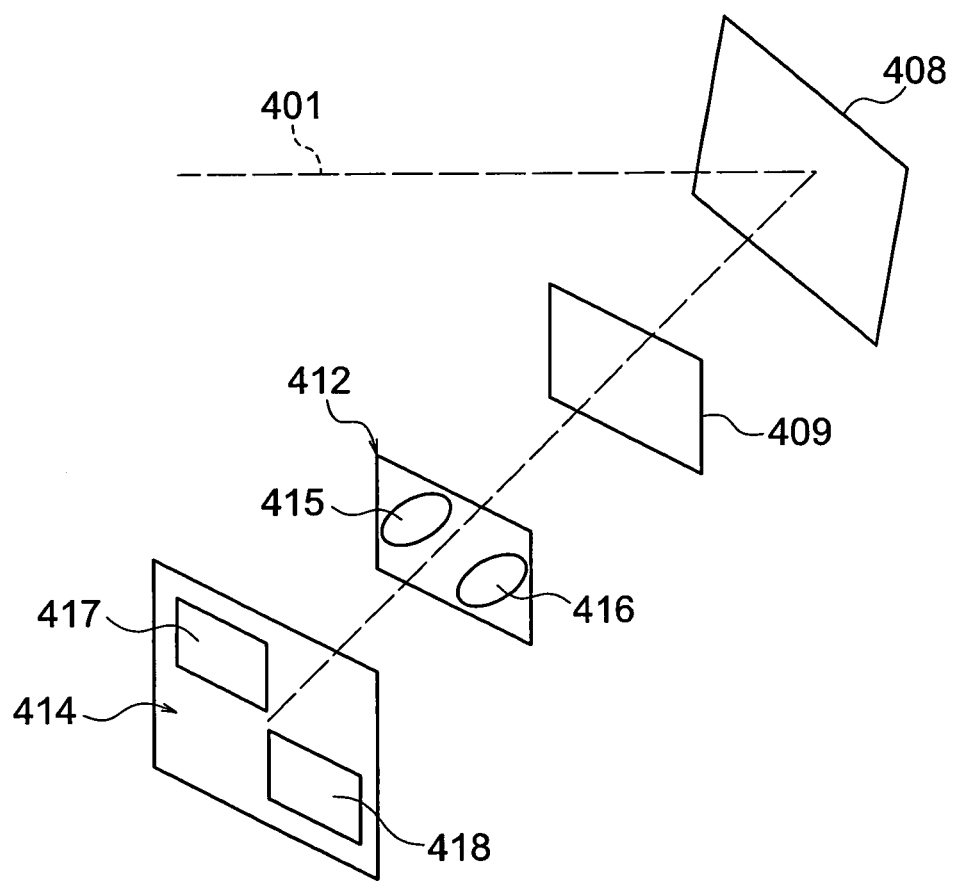
FIG. 21 is a diagram showing a structure of an AF optical system according to the fourth embodiment of the present invention.
Figure 22A:
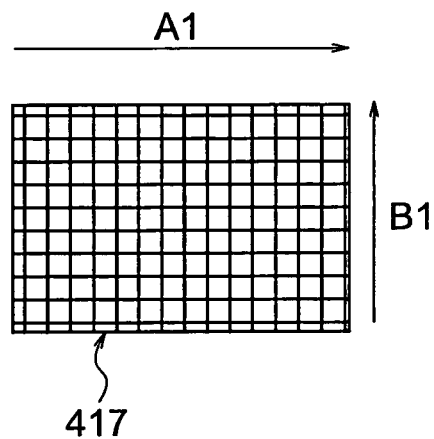
FIG. 22A is a plan view showing a first image pickup surface for the first pixel set.
Figure 22B:
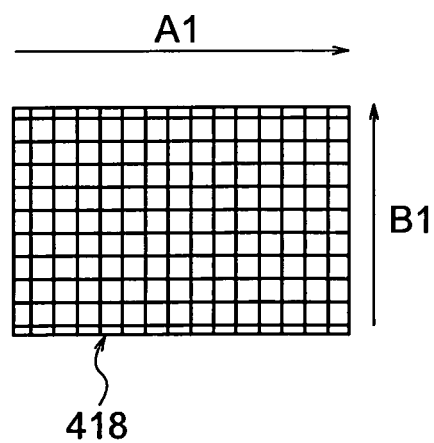
FIG. 22B is a plan view showing a second image pickup surface for the second pixel set.

FIG. 20 is a conceptual diagram showing a structure of a single-lens reflex camera according to a fourth embodiment of the present invention. FIG. 21 is a diagram showing a structure of an AF optical system according to the fourth embodiment. FIG. 22A is a plan view showing a first image pickup surface 417 for a first pixel set, and FIG. 22B is a plan view showing a second image pickup surface 418 for a second pixel set.

The fourth embodiment is an embodiment in which, the image pickup apparatus according to the present invention is applied to the single-lens reflex camera.

FIG. 20 shows a state at the time of AF ranging and a finder observation in the single-lens reflex camera. An optical axis (direction in which light rays advance) 401 passes through a taking lens 402, and reaches a main mirror 404 which includes a half mirror. Light rays which are reflected at the main mirror 404, upon passing through a focal plane plate 405, a pentaprism 406, and an eyepiece 407, is incident on a pupil of a photographer (not shown in the diagram), and serves as a finder.

At the time of taking a picture, by causing the main mirror 404 and a sub mirror 408 to retract from a photographic optical path, it is possible to project an object image on an image pickup element 403.

Whereas, light which has transmitted through the main mirror 404 is reflected at the sub mirror 408, and is incident on an AF optical system which is described below.

In other words, light which has been reflected at the sub mirror 408, upon passing through a field stop 409, a condenser lens 410, and a reflecting surface 411, is incident on a pupil dividing diaphragm 412. The light which has been incident on the pupil dividing diaphragm 412 is separated to a light beam for the first pixel set and a light beam for the second pixel set, and is incident on an image pickup surface 414 for AF upon passing through a separator lens 413. The pupil dividing diaphragm 412 is to be structured to be in conjugation with the exit pupil assumed in the taking lens 402.

Four divided areas which are separated by a horizontal line and a vertical line having the optical axis 401 as a center are set in an exit pupil inside the taking lens 402. A first pupil area has a center of gravity in one of the four divided areas, and a second pupil area has a center of gravity in a divided area which is symmetrical to a divided area having the center of gravity of the first pupil area with respect to the optical axis 401.

As shown in FIG. 21, a first aperture portion 415 which is disposed at an upper left side with respect to the optical axis 401 and a second aperture portion 416 which is disposed at a lower right side with respect to the optical axis 401 are disposed in the pupil dividing diaphragm 412. The light beam for the first pixel set passes through the first aperture portion 415, and the light beam for the second pixel set passes through the second aperture portion 416.

As shown in FIG. 21, a first image pickup surface 417 which is disposed at the upper left side with respect to the optical axis 401, and a second image pickup surface 418 which is disposed at the lower right side with respect to the optical axis 401 are disposed in the image pickup surface 414 for AF. A plurality of pixels (first pixel set) is arranged two-dimensionally in the first image pickup surface 417, and receives the light beam for the first pixel set from the first pupil area. A plurality of pixels (second pixel set) is arranged two-dimensionally in the first image pickup surface 418, similarly as in the first image pickup surface 417, and receive the light beam for the second pixel set from the second pupil area.

When output signals from pixels at positions corresponding mutually to the first image pickup surface 417 shown in FIG. 22A, and the second image pickup surface 418 shown in FIG. 22B are compared in the first direction A1, it is possible to calculate a phase difference in the left-right direction, and when the output signals from the pixels at positions corresponding mutually to the first image pickup surface 417 shown in FIG. 22A and the second image pickup surface 418 shown in FIG. 22B are compared in the second direction, it is possible to calculate a phase difference in the vertical direction. Therefore, it is possible to detect an amount of defocus of the taking lens 402 from information of the phase difference.

In the fourth embodiment, an example in which, the first pixel set and the second pixel set are separated to the first image pickup surface 417 and the second image pickup surface 418 inside the image pickup surface 414 for AF has been cited. However, instead of such arrangement, the image pickup surface may be let to be common and may be separated by time-division. In this case, since it is possible to detect phase difference in two directions by time-division carried out twice, it is possible to shorten ranging time, and to improve an accuracy of ranging for a body in motion.

The rest of the structure, action, and effect are similar as in the first embodiment.

(Fifth Embodiment)

Figure 23:
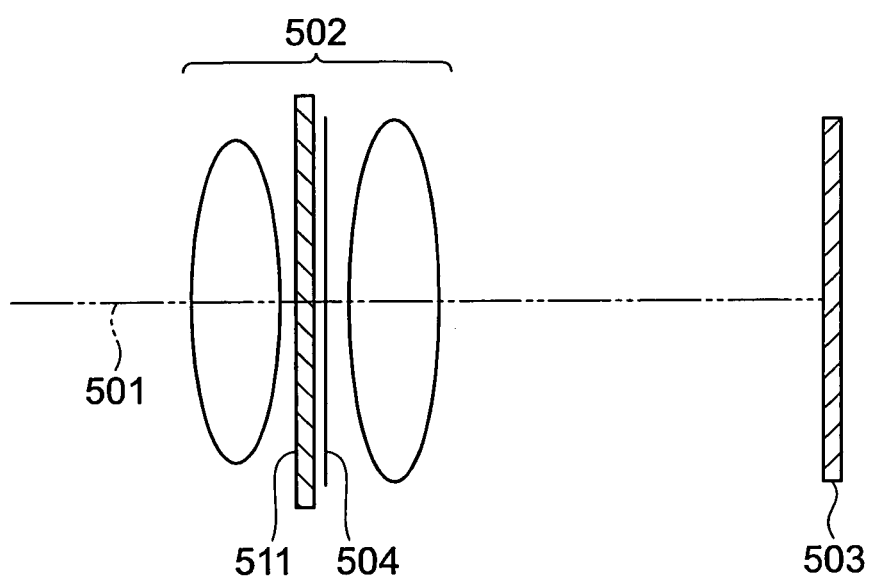
FIG. 23 is a diagram showing a schematic structure of an image pickup apparatus according to a fifth embodiment of the present invention.
Figure 24:
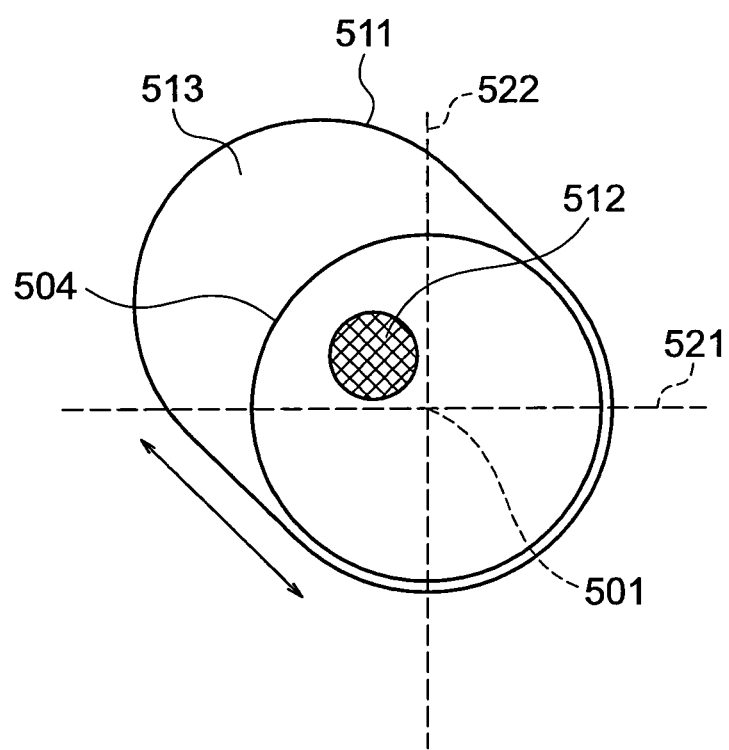
FIG. 24 is a diagram showing a light shielding unit according to the fifth embodiment overlapping with an aperture stop from a direction of the optical axis, and is a diagram showing a state in which, a light shielding portion is at an upper left side of the optical axis.
Figure 25:
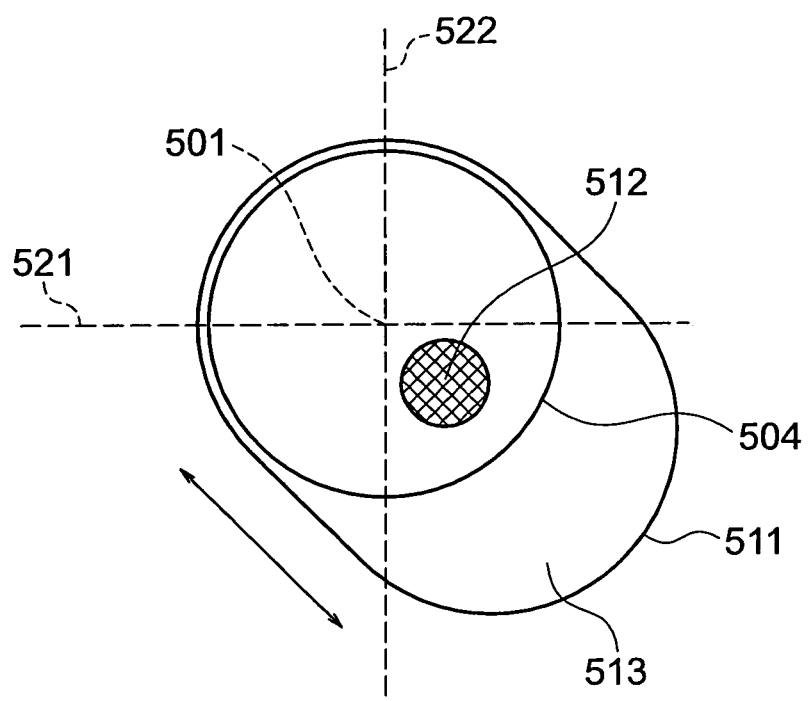
FIG. 25 a diagram showing the light shielding unit according to the fifth embodiment overlapping with the aperture stop from the direction of the optical axis, and is a diagram showing a state in which, the light shielding portion is at a lower right side of the optical axis.

FIG. 23 is a diagram showing a schematic structure of an image pickup apparatus according to a fifth embodiment of the present invention. FIG. 24 is a diagram showing a light shielding unit 511 overlapping with an aperture stop 504 from a direction of an optical axis 501, and is a diagram showing a state in which, a light shielding portion 512 is at an upper left side of the optical axis 501. FIG. 25 is a diagram showing the light shielding unit 511 overlapping with the aperture stop from the direction of the optical axis, and is a diagram showing a state in which, the light shielding portion 512 is at a lower right side of the optical axis 501.

The fifth embodiment is an embodiment of an image pickup apparatus in which, a first pupil area and a second pupil area are generated by time-division.

As shown in FIG. 23, an image pickup element 503 is disposed on the optical axis 501 of a taking lens system 502. The taking lens system 502 includes the aperture stop 504, and the light shielding unit 511 which has been disposed near an object side of the aperture stop 504.

It is desirable that the light shielding unit 511, as shown in FIG. 23, is disposed near the aperture stop 504 in the taking lens system 502. However, the light shielding unit 511 is not restricted to be disposed at such position.

As shown in FIG. 24 and FIG. 25, the light shielding unit 511 includes the light shielding portion 512 which shields incident light, and a transparent portion 513 which transmits the incident light. By moving the light shielding unit 511 within a plane orthogonal to the optical axis 501, the light shielding portion 512 can assume two positions sandwiching the optical axis 501. The two positions are in an area at an upper left side and an area at a lower right side respectively, which are symmetrical about the optical axis 501, from among the four divided areas which are divided by a vertical line 522 and a horizontal line 521 having the optical axis 501 as a center. The light shielding unit 511 is driven by a drive source not shown in the diagram, to assume any of a state in which, the light shielding portion 512 is at the upper left side of the optical axis 501 as shown in FIG. 24, and a state in which, the light shielding portion 512 is at the lower right side of the optical axis 501 as shown in FIG. 25. For switching between these two states, apart from moving the light shielding unit 511 in a direction connecting the two positions, the light shielding unit 511 may be rotated around the optical axis 501 as a center, or a state of light transparent and a state of light attenuation or light shielding may be switched electrically.

In the state shown in FIG. 24, the light beam from the first pupil area having the center of gravity in the area at the lower right side of the optical axis 501 is received by the plurality of pixels which forms the first pixel set of the image pickup element 503. In the state shown in FIG. 25, the light beam from the second pupil area having the center of gravity in the area at the upper left side of the optical axis 501 is received by the plurality of pixels which forms the second pixel set of the image pickup element 503. By realizing these two states by time-division, detection of phase-difference information becomes possible, and it is possible to calculate an amount of defocus at each site on a screen. Moreover, it is possible to carry out image formation for each recorded image in FIG. 24 and FIG. 25. Particularly, by positioning the light shielding portion 512 near the optical axis 501, images for recording (captured images) generated from the states in FIG. 24 and FIG. 25 become almost same, these two states can be used upon mixing in video etc.

(Sixth Embodiment)

Figure 26:
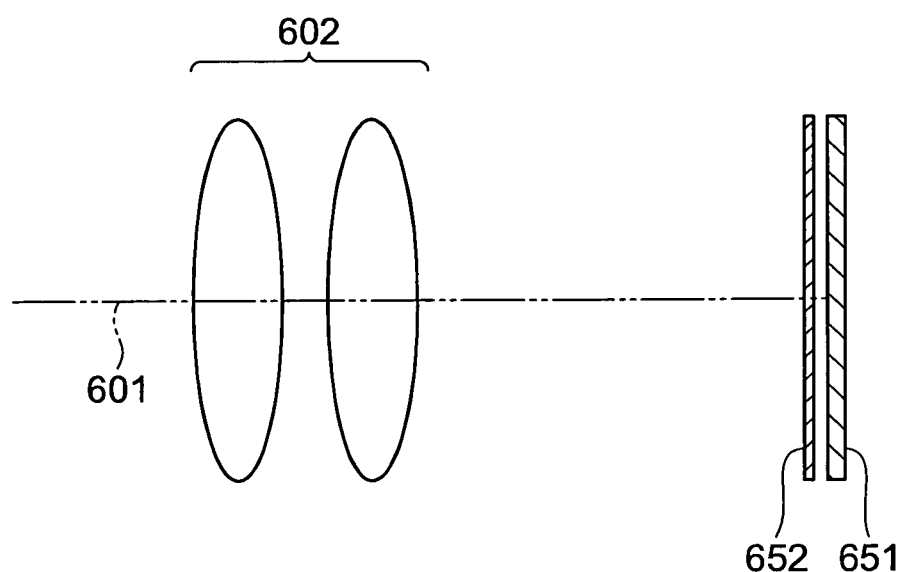
FIG. 26 is a diagram showing a schematic structure of an image pickup apparatus according to a sixth embodiment of the present invention.
Figure 27:
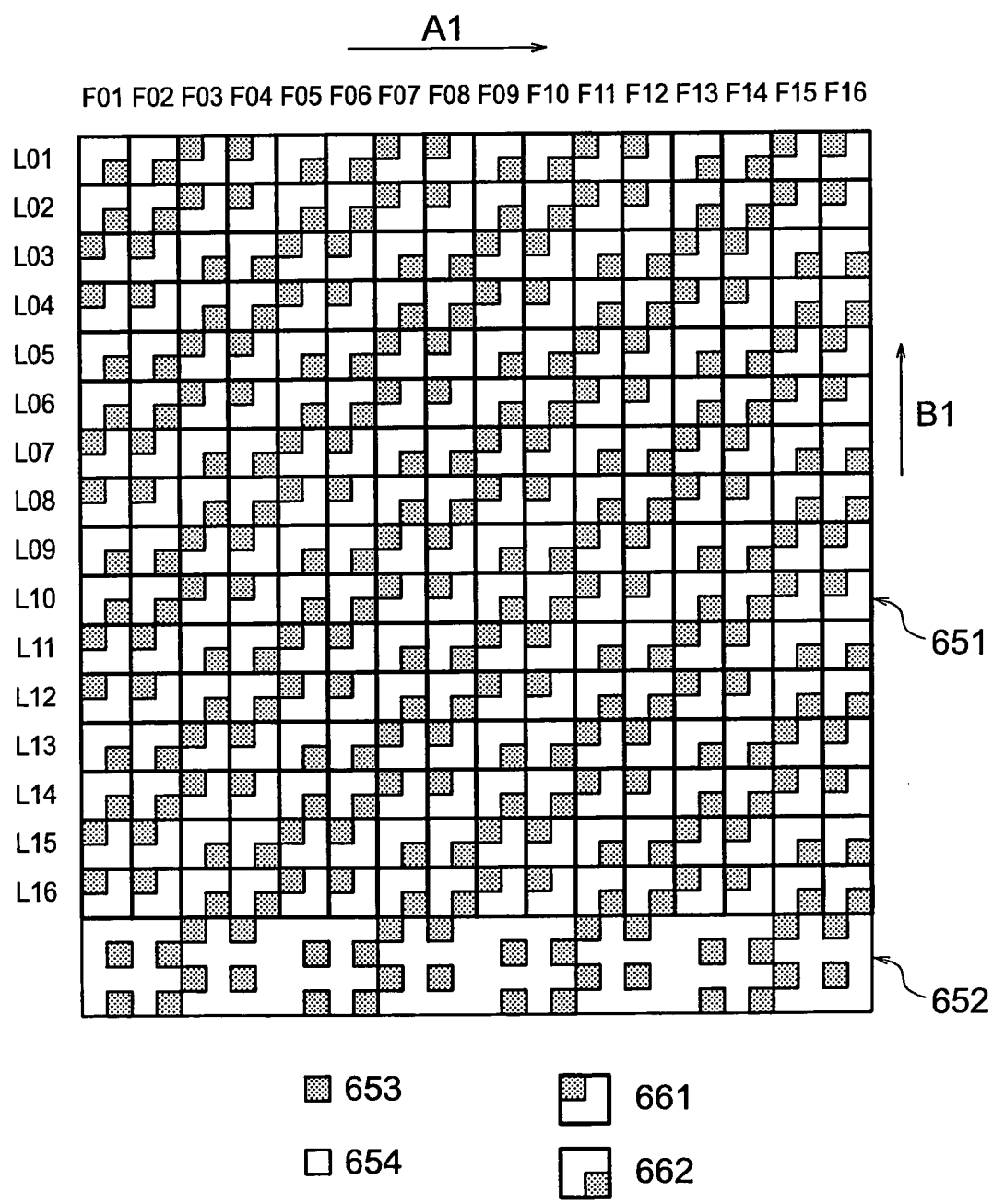
FIG. 27 is a plan view showing a light shielding unit overlapping with an image pickup element according to the sixth embodiment, and is a diagram showing a state in which, pixels in a second row at a lower portion of the light shielding unit do not overlap with the image pickup element.
Figure 28:
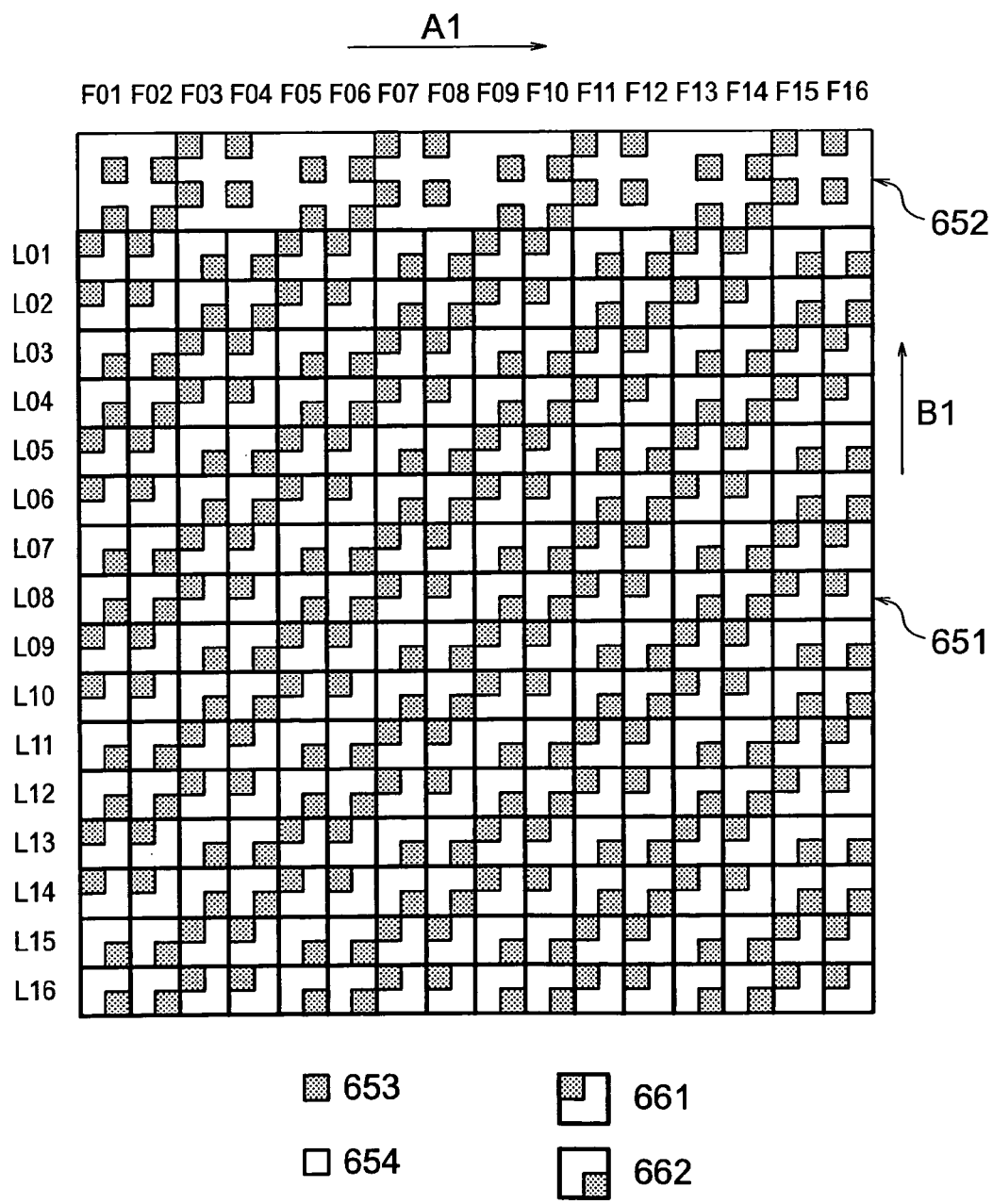
FIG. 28 is a plan view showing the light shielding unit overlapping with the image pickup element according to the sixth embodiment, and is a diagram showing a state in which, the pixels in a second row at an upper portion of the light shielding unit do not overlap with the image pickup element.
Figure 29:
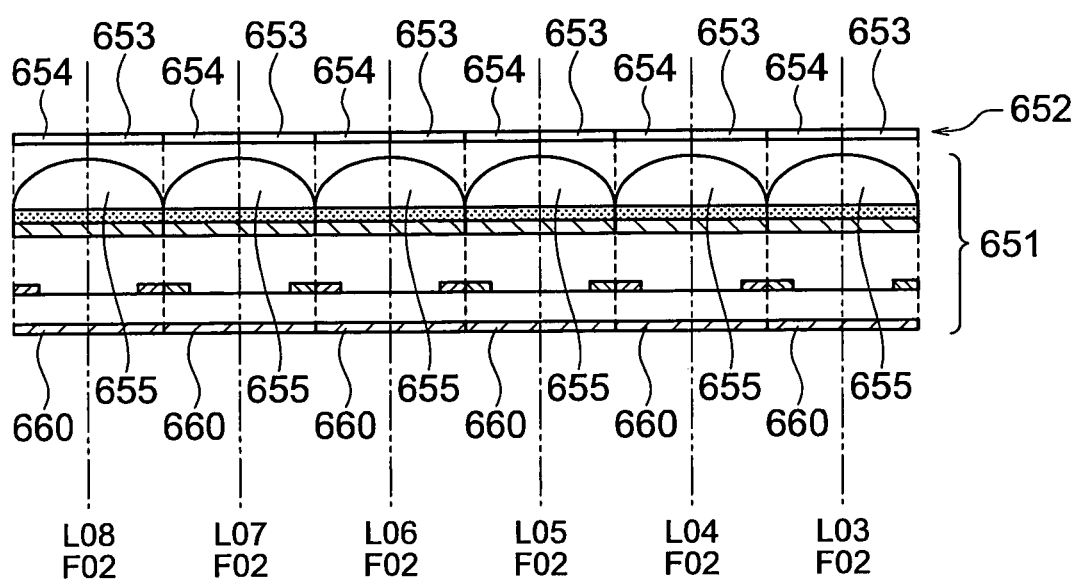
FIG. 29 is a cross-sectional view showing a structure of pixels, and is a diagram corresponding to the state shown in FIG. 27.
Figure 30:
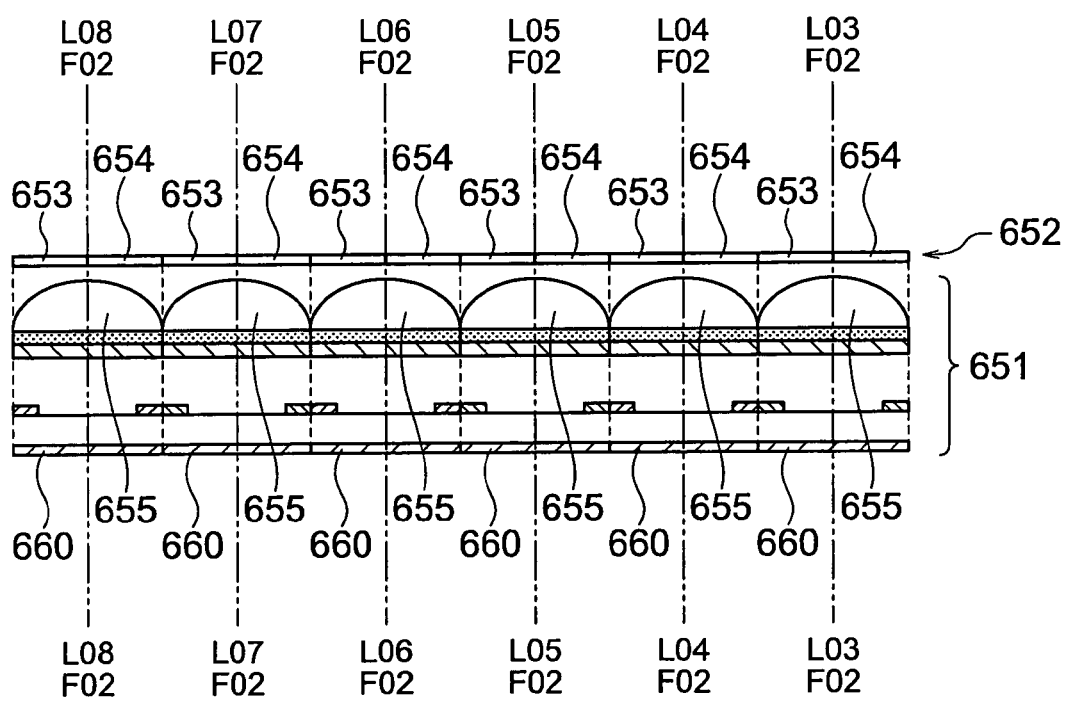
FIG. 30 is a cross-sectional view showing a structure of pixels, and is a diagram corresponding to the state shown in FIG. 28.

FIG. 26 is a diagram showing a schematic structure of an image pickup apparatus according to a sixth embodiment of the present invention. FIG. 27 is a plan view showing a light shielding unit 652 overlapping with an image pickup element 651, and is a diagram showing a state in which, pixels in a second row at a lower portion of the light shielding unit 652 do not overlap with the image pickup element 651. FIG. 28 is a plan view showing the light shielding unit 652 overlapping with the image pickup element 651, and is a diagram showing a state in which, the pixels in a second row at an upper portion of the light shielding unit 652 do not overlap with the image pickup element 651. FIG. 29 is a cross-sectional view showing a structure of pixels, and is a diagram corresponding to the state shown in FIG. 27. FIG. 30 is a cross-sectional view showing a structure of pixels, and is a diagram corresponding to the state shown in FIG. 28.

The sixth embodiment is an embodiment of an image pickup apparatus in which, a first pupil area and a second pupil area are generated by time-division.

In the image pickup apparatus according to the sixth embodiment, the image pickup element 651 is disposed on an optical axis 601 of a taking lens 602. An on-chip lens 655 is disposed at a position corresponding to a photoelectric conversion surface 660 of each pixel of the image pickup element 651. The light shielding unit 652 for assuming an exit pupil is disposed near an object side of the on-chip lens 655. The light shielding unit 652 may be a light attenuating unit.

The light shielding unit 652 is a unit such as a light shielding filter, and for each pixel of the image pickup element 651, sets four divided areas which are separated by a line corresponding to the first direction A1 of the image pickup element 651, and a line corresponding to the second direction of the image pickup element 651. The light shielding unit 652 includes a light shielding area 653 which shields incident light, and a transparent area 654 which transmits the incident light.

A plurality of pixels of the image pickup element 651 form a first pixel set 661 of which, an upper left side is covered by the light shielding area 653, and a second pixel set 662 of which, a lower right side is covered by the light shielding area 653. In the states shown in FIG. 27 and FIG. 28, the first pixel set 661 and the second pixel set 662 are formed in a checkered pattern in units of four pixels.

The upper left portion of each pixel forming the first pixel unit 661 is covered by the light shielding area 653, and a portion of each pixel excluding the upper left portion receives light which has transmitted through the transparent area 654 as the first pupil area. Consequently, corresponding to the pixels of the first pixel set 661, there exists a center of gravity of the first pupil area in the lower right portion of the pixels, which is one of the four divided areas.

Moreover, the lower right portion of each pixel forming the second pixel set 662 is covered by the light shielding area 653, and a portion of each pixel excluding the lower right portion receives light which has been transmitted through the transparent area 654 as the second pupil area. Consequently, corresponding to the pixels of the second pixel set 662, there exists a center of gravity of the second pupil area in the upper left portion of the pixels, which is one of the four divided areas.

Here, by disposing the first pixel set and the second pixel set as shown in FIG. 9, and using a color filter shown in FIG. 10, it is possible to achieve a color image by a similar concept as in the case of the first embodiment.

In the state shown in FIG. 27, four pixels at the upper left side of the image pickup element 651 become the second pixel set 662. In the state shown in FIG. 28 in which, the light shielding unit 652 is moved upward by two rows with respect to the state in FIG. 27, four pixels at the upper left side of the image pickup element 651 become the first pixel set 661. Consequently, the pixels which were the first pixel set 661 in the state of FIG. 27 become the second pixel set 662 in the state of FIG. 28, and pixels which were the second pixel set 662 become the first pixel set 661.

For switching from the state in FIG. 27 to the state in FIG. 28, a light shielding member may be moved by a drive unit not shown in the diagram, or, the image pickup element may be moved. Moreover, for driving the light shielding member or the image pickup element, a drive system for preventing shaking may be used.

According to the abovementioned arrangement, by comparing outputs from the same pixel in the state in FIG. 27 and the state in FIG. 28, it is possible to acquire the phase-difference information.

A state in which all pixels is the first pixel set, and a state in which all pixels is the second pixel set may be formed by time-division.

Figure 31:
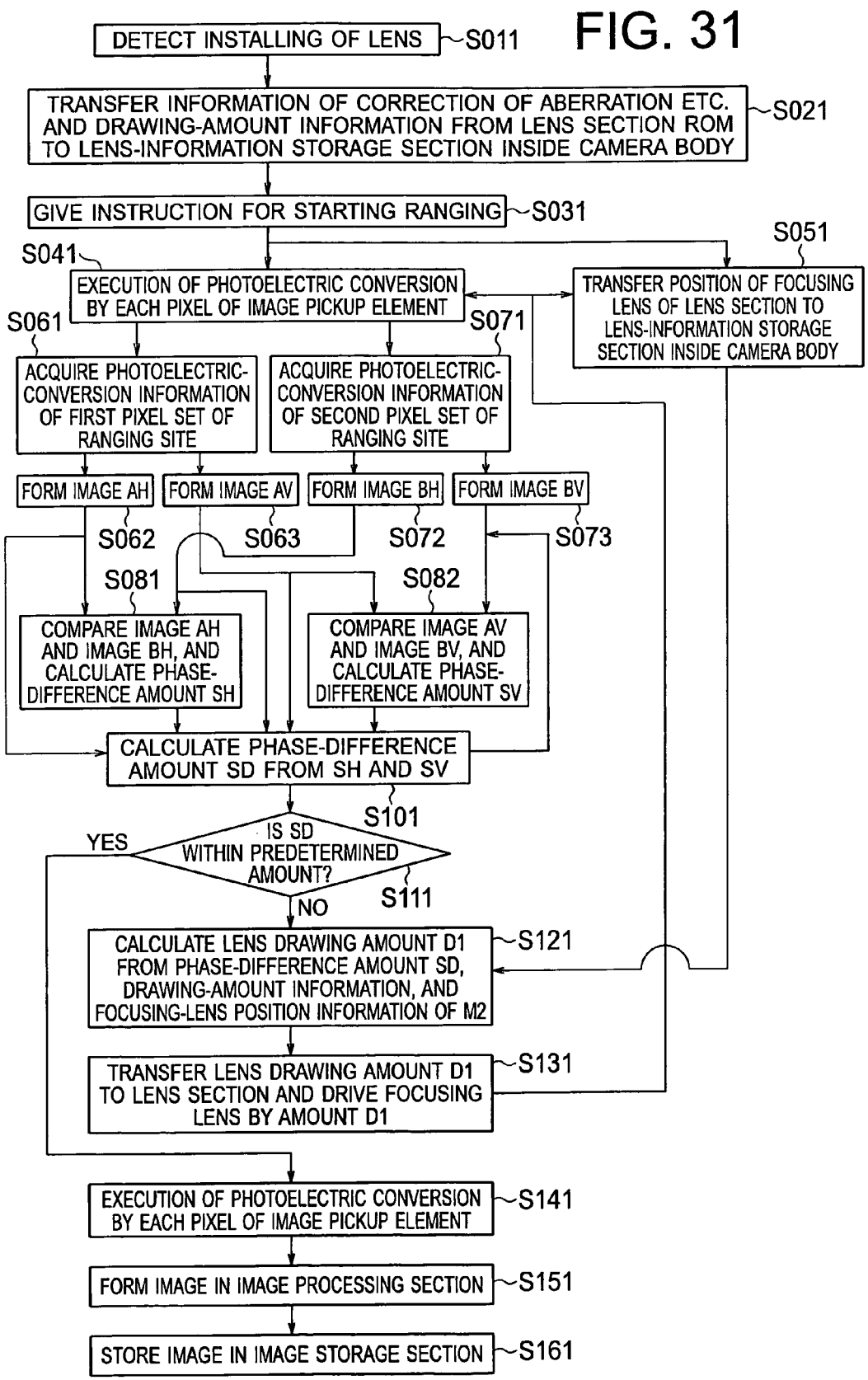
FIG. 31 is a flowchart showing a flow of a process of the image pickup apparatus according to the sixth embodiment.
Figure 32:
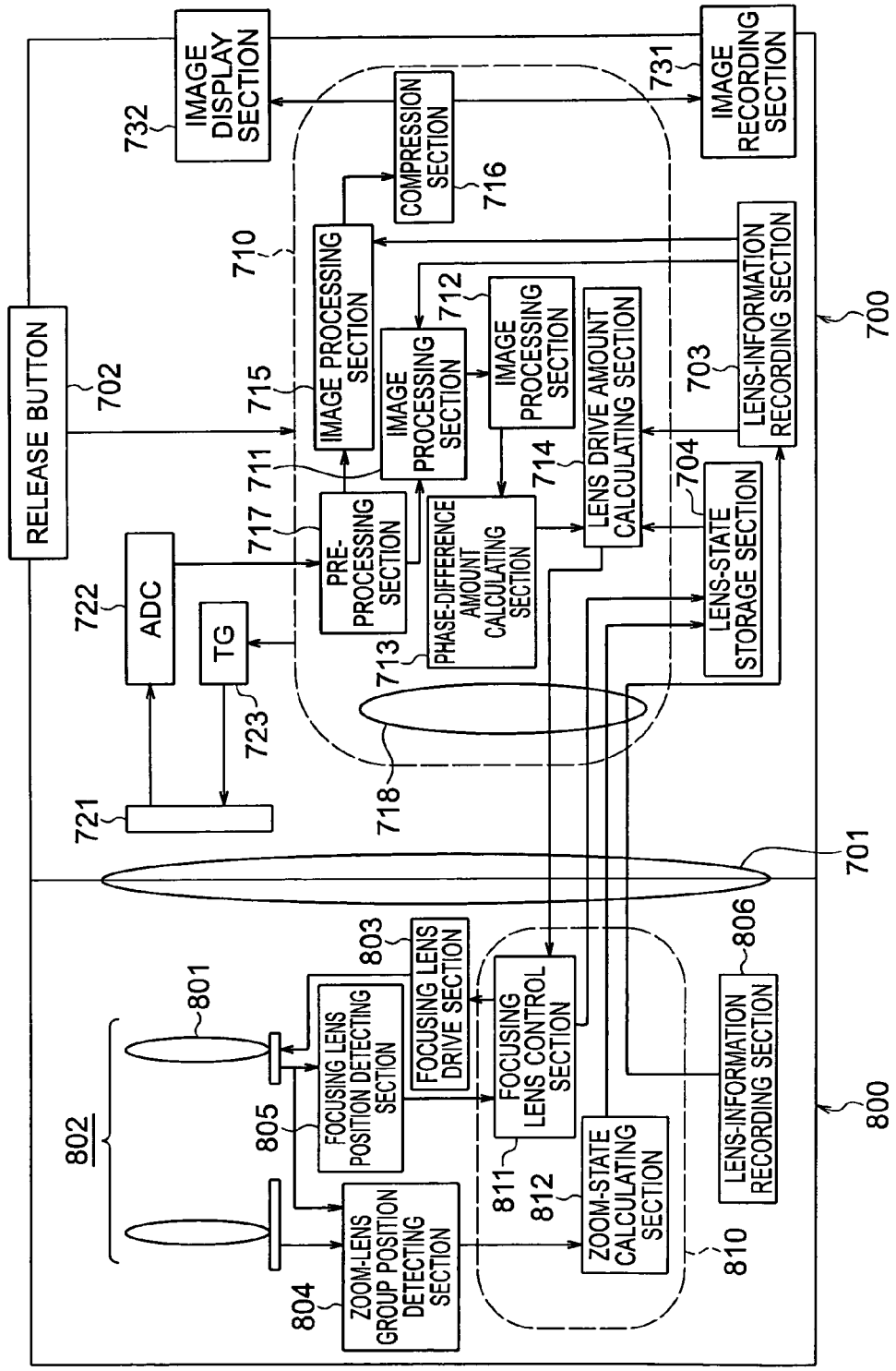
FIG. 32 is a block diagram showing in further detail, a structure of a camera system of an interchangeable lens type according to the sixth embodiment.

Next, a flow of a process when an interchangeable-lens camera system is used as the image pickup apparatus of the sixth embodiment will be described below. FIG. 31 is a flowchart showing a flow of a process of the image pickup apparatus according to the sixth embodiment. FIG. 32 is a block diagram showing in further detail, a structure of an interchangeable-lens camera system according to the sixth embodiment.

Firstly, as shown in FIG. 32, in the interchangeable-lens camera system, when an interchangeable lens 800 is installed on a body mounting/lens mounting coupling portion 701 of a camera body (camera main body) 700, installing of the lens is detected at camera body 700 side (step S011).

Next, information such as drawing-amount information and aberration information which have been stored in a lens-information recording section 806 inside the interchangeable lens 800 is transferred to a lens-information recording section 703 inside the camera body 700, and is stored in the lens-information recording section 703 (step S021).

By an operation by a user such as half pressing of a release button (shutter button) 702, an instruction signal for starting ranging is output to a camera controller (step S031). At this time, a process of setting a ranging site may be added. The setting of the ranging site may be carried out manually by the user, or, the setting may be carried out according to a procedure which has been set in advance in the camera.

By step S031, each pixel of an image pickup element 721 carries out photoelectric conversion (step S041). At this time, pixels which carry out photoelectric conversion may be set selectively according to the requirement.

A signal which has been subjected to photoelectric conversion is converted to a digital signal by an ADC (analog to digital converter) 722, and is output to a pre-processing section 717. In the pre-processing section 717, a process of conversion to a format suitable for processing in image processing sections 715 and 711 is carried out. Moreover, the image pickup element 721 is operated according to an output from a TG (timing generator) which is controlled by a camera controller 710.

By step S031, focusing-lens position information which has been stored in a zoom-state calculating section 812 of the interchangeable lens 800 is transferred to and stored in a lens-state storage section 704 in the camera body 700 (step S051). Here, when the interchangeable lens 800 is a zoom lens, in addition to the focusing-lens position information, information of focal length may also be transferred. The focusing-lens position information is information which, the zoom-state calculating section 812 has calculated by a predetermined method, based on position information of a taking lens system 802 including a focusing lens 801, which a zoom-lens group position detecting section 804 has detected.

By the photoelectric conversion carried out at step S041, the image processing section 711 acquires photoelectric-conversion information of the first pixel set 661 of the ranging site, and forms an image A (step S061). Here, the aberration information which has been acquired at step S021 may be added.

By using the photoelectric-conversion information which has been acquired at step S061, the image processing section 712 forms an AH image for acquiring the phase-difference information in the horizontal direction (step S082) and also forms an image AV for acquiring the phase-difference information in the vertical direction.

By the photoelectric conversion which has been carried out at step S041, the image processing section 711 acquires photoelectric conversion information of the second pixel set 662 of the ranging site, and forms an image B (step S071).

Furthermore, the image processing section 712, by using the photoelectric conversion information which has been acquired at step S071, forms an image BH for acquiring the phase-difference information in the horizontal direction (step S072), and also forms an image BV for acquiring the phase-difference information in the vertical direction (step S073).

Next, a phase-difference information calculating section 713 calculates a phase-difference amount SH from the image AH and the image BH (step S081), and calculates a phase-difference amount SV from the image AV and the image BV (step S082). Furthermore, the phase-difference information calculating section 713, from the phase-difference amounts SH and SV, calculates a phase-difference amount SD for calculating the amount of defocus (step S101). The phase-difference amount SD may be an average value of the phase-difference amount SH and the phase-difference amount SV, or values of the phase-difference amounts SH and SV which have been judged to be highly accurate from contrast values of the image AV, or the image BV, the image AH, and the image BH may be used as the phase-difference amount SD, or the phase-difference amount SD may be determined manually.

When the phase-difference amount SD calculated at step S101 is within a predetermined amount, a lens drive amount calculating section 714 makes a judgment of a focused state, and when the phase-difference amount SD calculated at step S101 surpasses the predetermined amount, the lens drive amount calculating section 714 makes a judgment of not being in a focused state (step S111). Here, the predetermined amount may be set from an image-plane depth which is calculated from the minimum diameter of a circle of confusion, or information from the taking lens may be referred to.

When a judgment has been made at step S111 that the phase-difference amount SD has surpassed the predetermined amount (NO at step S111), the lens drive amount calculating section 714 calculates a lens drawing amount D1 from the phase-difference information, information of drawing which has been stored in the lens-information recording section 703, and information such as a focusing-lens position which has been stored in lens-state storage section 704 (step S121). The lens drawing amount D1 may be an amount in the direction of drawing, or may be a control value such as a drive pulse of a focusing lens drive section 803 (motor) which drives the focusing lens 801.

The camera controller 710 transfers the information of the lens drawing amount D1 which has been calculated at step S121 to a lens controller 810 of the interchangeable lens 800. Based on the lens drawing amount D1 which has been transferred, a focusing-lens control section 811 makes the focusing-lens drive section 803 drive the focusing lens 801 only by the lens drawing amount D1 (step S131). At this time, the focusing-lens control section 811 controls the focusing-lens drive section 803 based on position information of the focusing lens 801 which has been detected by a focusing-lens position detecting section 805. Communication between the camera controller 710 and the lens controller 810 is controlled by a communication control section 718 inside the camera controller 710.

After the focusing lens 801 is driven at step S131, the process returns to steps S041 and S051 and the camera controller 710 checks whether or not the focused state is assumed.

Whereas, at step S111, when the lens drive amount control section 714 has made a judgment that the phase-difference amount SD is within the predetermined amount (YES at step S111), photoelectric conversion is carried out in each pixel of the image pickup element 721 (step S141). The image processing section 715 carries out image formation based on a signal which is subjected to photoelectric conversion (step S151). In other words, the image processing section 715 generates a photographic image. The image which has been formed is compressed to a predetermined format at a compression section 716, and is recorded in an image recording section 731 (step S161). Moreover, the compressed image is displayed on an image display section 732.

At step S151, apart from the image formation, an image processing appropriate for the entire image may be carried out by the information which has been recorded in the lens-information recording section 703.

The image recording section 731 may be a memory which has been provided inside the camera body 700, or may be an external memory which has been installed in the camera body 700.

As it has been described above, in FIG. 31, an arrangement has been made such that after, step S131, the process returns to step S041 and step S051, and at a point where the phase-difference amount SD is same as or less than the predetermined amount (YES at step S111), the process advances to step S141. Whereas, in a case in which an AF speed is to be prioritized, after step S131, the process, without returning to step S041 and S051, may advance directly to step S141. Moreover, in a case in which the process returns to steps S041 and step S051 after step S131, an arrangement may be made such that, when the judgment at step S111 has surpassed a specified frequency, the process returns to step S141, and a photographic image is achieved assuredly.

Figure 33:
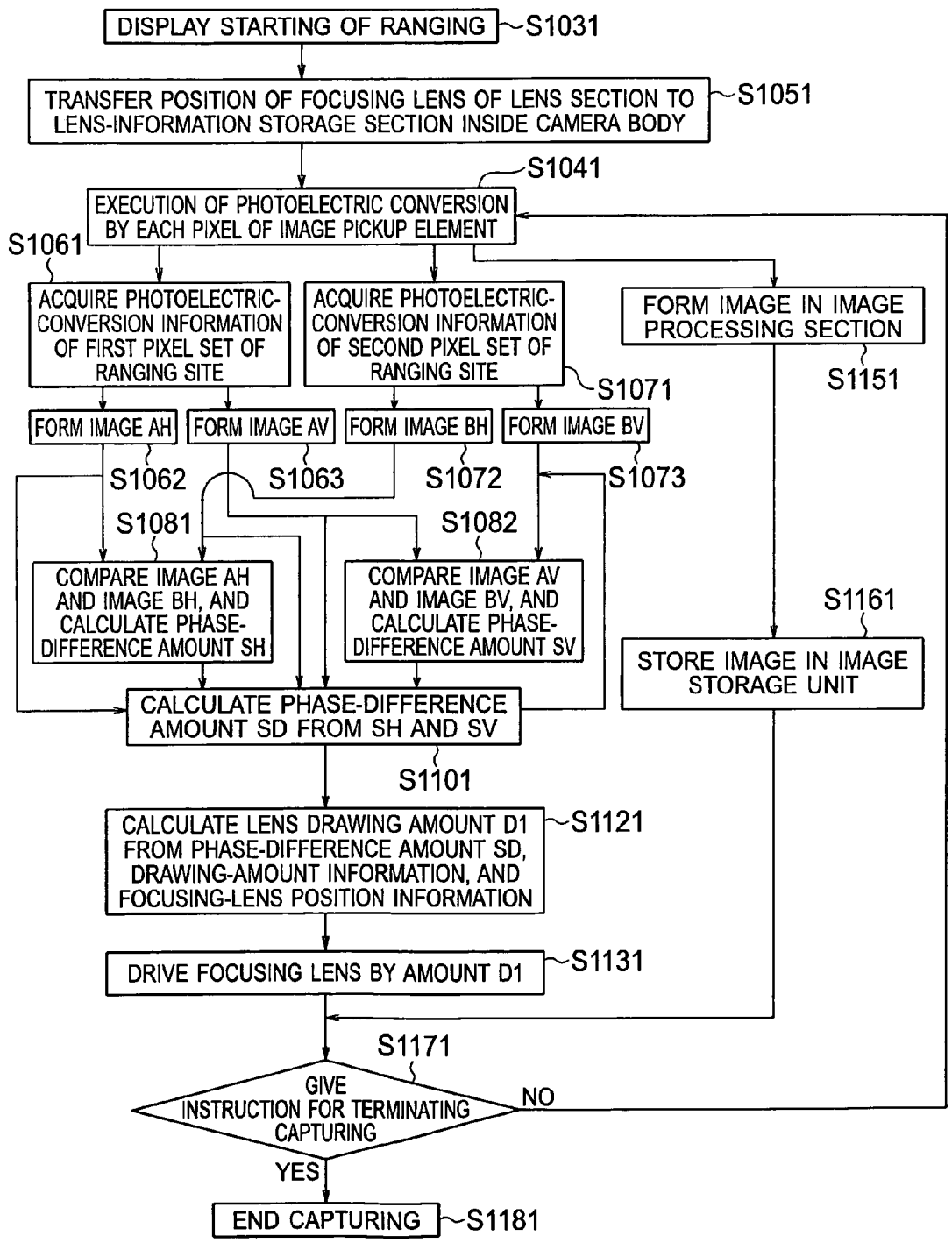
FIG. 33 is a flowchart showing a flow of a process of the image pickup apparatus according to the sixth embodiment.
Figure 34:
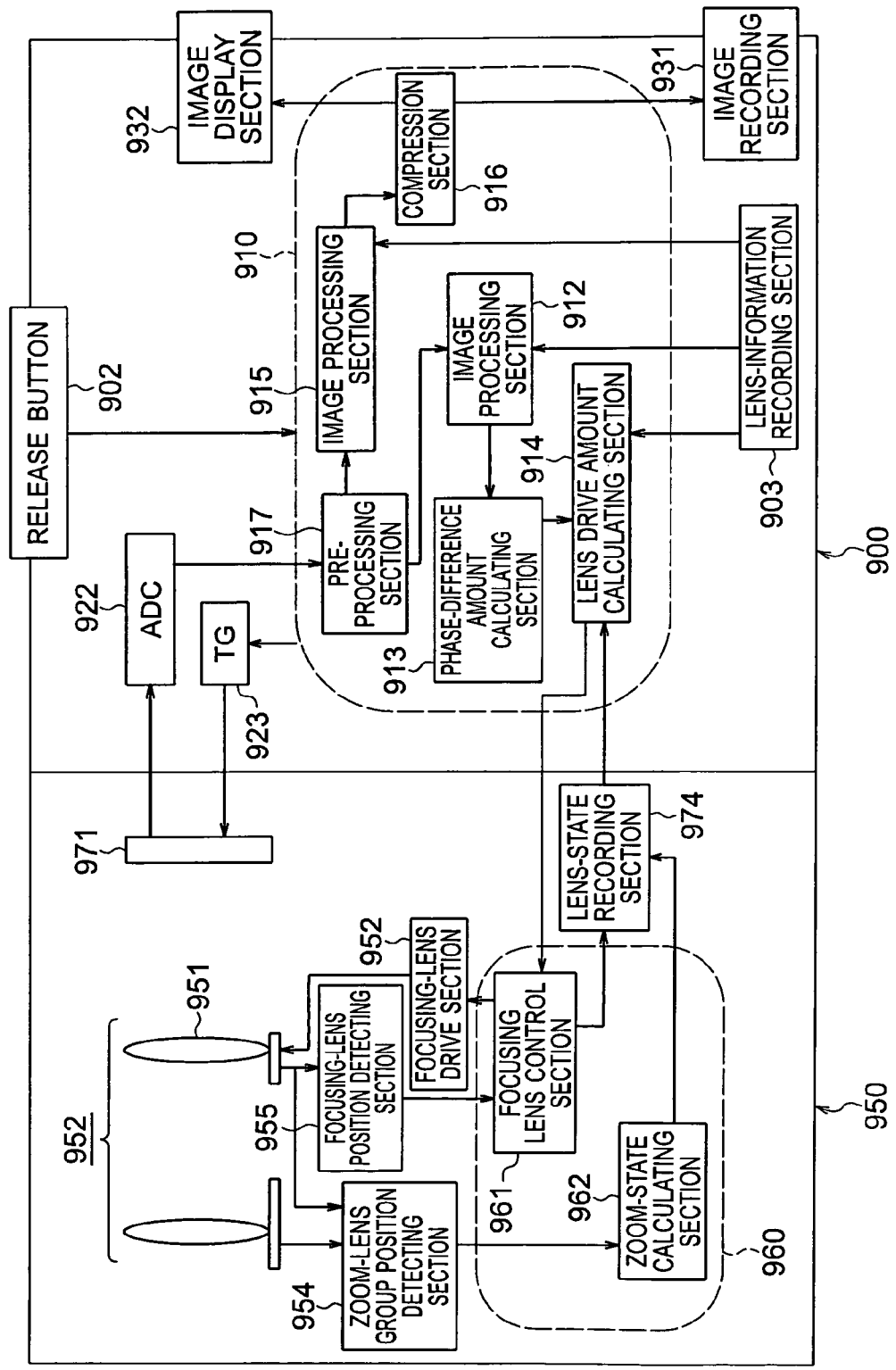
FIG. 34 is a block diagram showing in further detail, a structure of a camera of an integrated-lens type according to the sixth embodiment.

Next, a flow of a process when camera of a lens-integrated type is used as an image pickup apparatus according to the sixth embodiment will be described below by referring to FIG. 33 and FIG. 34. FIG. 33 is a flowchart showing a flow of a process of the image pickup apparatus according to the sixth embodiment. FIG. 34 is a block diagrams showing in further detail, the camera of the integrated-lens type (image pickup apparatus).

Firstly, before the flow shown in FIG. 33 starts, data such as information of drawing amount and aberration information is stored in a lens-information recording section 903 of a camera body 900.

In a case of taking video image for instance, by an operation by a user such as half pressing of a release button 902, an instruction signal for starting ranging is output to a camera controller 910 (step S1031).

Focusing-lens position information of a taking lens is to be recorded in a lens-state recording section 974. When the taking lens is a zoom lens, a state of focal length may also be stored in addition (step S1051). Each pixel of an image pickup element carries out photoelectric conversion (step S1041). A signal which has been subjected to photoelectric conversion is converted to a digital signal by an ADC (analog to digital converter) 922, and is output to a pre-processing section 917. In the pre-processing section 917, a process of conversion to a format suitable for processing in image processing sections 915 and 911 is carried out. Moreover, an image pickup element 971 is operated according to an output from a TG (timing generator) which is controlled by the camera controller 910.

Based on the photoelectric conversion carried out at step S1041, the image processing section 915 carries out image formation (step S1151). An image which has been formed is compressed to a predetermined format in a compression section 916, and is stored in an image recording section 931 (image recording unit) (step S1161). Moreover, the image which has been compressed is displayed on an image display section 732.

Here the description has been made on the premise of video photography. However, steps shown in FIG. 33 are also applicable to a case of still photography.

By step S1031, focusing-lens position information which has been stored in a zoom-state calculating section 962 of a lens section 950 is transferred to and stored in a lens-state recording section 974. Here, when the lens section 950 is a zoom lens, in addition to the focusing-lens position information, information of a state of a focal length may also be transferred. The focusing-lens position information is information which, a zoom-state calculating section 962 has calculated by a predetermined method, based on position information of a taking lens system 952 including a focusing lens 951, which a zoom-lens group position detecting section 954 has detected.

By the photoelectric conversion carried out at step S1041, an image processing section 912 acquires photoelectric conversion information of the first pixel set 661 of the ranging site, and forms an image A (step S1061). At this time, the setting of the ranging site may be carried out manually by the user, or, the setting may be carried out according to a procedure which has been set in advance in the camera.

Furthermore, by using the photoelectric conversion information which has been acquired at step S1061, the image processing section 912 forms an image AH for acquiring the phase-difference information in the horizontal direction (step S1062), and also forms an image AV for acquiring the phase-difference information in the vertical direction (step S1063).

By the photoelectric conversion which has been carried out at step S1041, the image processing section 912 acquires photoelectric conversion information of the second pixel set 662 of the ranging site, and forms an image B (step S1071). Furthermore, the image processing section 912, by using the photoelectric conversion information which has been acquired at step S1071, forms an image BH for acquiring the phase-difference information in the horizontal direction (step S1072) and also forms an image BV for acquiring the phase-difference information in the vertical direction (step S1073).

Next, a phase-difference amount calculating section 913 calculates a phase-difference amount SH from the image AH and the image BH (step S1081), and calculates a phase-difference amount SV from the image AV and the image BV (step S1082). Furthermore, the phase-difference amount calculating section 913, from the phase-difference amounts SH and SV, calculates a phase-difference amount SD for calculating the amount of defocus (step S1101). The phase-difference amount SD may be an average value of the phase-difference amount SH and the phase-difference amount SV, or values of the phase-difference amounts SH and SV which have been judged to be highly accurate from contrast values of the image AV, the image BV, the image AH, and the image BH may be used as the phase-difference amount SD, or the phase-difference amount SD may be determined manually.

Next, a lens drive amount calculating section 914 calculates a lens drawing amount D1 from the phase-difference information SD, information of drawing which has been recorded in the lens-information recording section 903, and information such as a focusing-lens position which has been recorded in the lens-state recording section 974 (step S1121). As a method for calculating the lens drawing amount D1, a method same as for calculating the phase-difference AF can be used. The lens drawing amount D1 may be an amount in the direction of drawing, or, may be a control value such as a drive pulse of a focusing lens drive section 952 (motor) which drives the focusing lens 951. Moreover, in a video, the drive amount may be set upon taking into consideration a mobile speed.

The camera controller 910 transfers the information of the lens drawing amount D1 which has been calculated at step S1121 to a lens controller 960 of a lens section 950. Based on the lens drawing amount D1 which has been transferred, a focusing lens control section 961 makes the focusing-lens drive section 952 drive the focusing lens 951 only by the lens drawing amount D1 (step S1131). At this time, the focusing-lens control section 961 controls the focusing-lens drive section 952 based on position information of the focusing lens 951 which has been detected by a focusing-lens position detecting section 955.

After the focusing lens 951 is driven, when there is an instruction for terminating capturing by an operation of a switch etc. on the camera body 900 (YES at step S1171), the capturing ends (step S1181). When there is no instruction for terminating capturing (NO at step S1171), the process returns to step S1041, and steps from photoelectric conversion onward are carried out.

Steps from step S1041 up to step S1131 may be let to advance once in a cycle in which, step S1151 and step S1161 are carried out plurality of times.

Moreover, according to the conditions, a flow of a contrast AF may be added to this flow.

The rest of the action, effect, and modified embodiments are similar as in a case of the abovementioned interchangeable-lens type camera system.

As it has bee described above, the image pickup optical system according to the present invention is useful for an image pickup optical system in which both of a high ranging accuracy and small-sizing are necessitated.

The image pickup apparatus according to the present invention shows an effect that it is possible to achieve a ranging signal of high accuracy from small-sizing or a small number of pixel sets.

What is claimed is:

1. An image pickup apparatus in which, a taking lens is installable or the taking lens is fixed, comprising:
   a color filter having a plurality of colors, and
   an image pickup element having a plurality of pixels, wherein
   all of the plurality of pixels of the image pickup element are arranged in rows two-dimensionally, and consist of two pixel sets having a first pixel set and a second pixel set, and
   an exit pupil is assumed, and
   four divided areas which are separated by two straight lines which are mutually orthogonal in a plane which is orthogonal to an optical axis thereof, are set in the exit pupil, and
   the pixels in the first pixel set are arranged to correspond to at least two colors of the color filter and arranged to receive a light beam from a first pupil area for which, a center of gravity of area is in one of the four divided areas, and
   a center of gravity of a second pupil area is in a divided area which is symmetrical, concerning the optical axis, to a divided area in which the center of gravity of the first pupil area lies, and
   the pixels in the second pixel set are arranged to correspond to at least two colors of the color filter and arranged to receive a light beam having a center of gravity of the second pupil area, and
   a signal from the first pixel set and a signal from the second pixel set are compared in at least one of directions of the two straight lines, and defocus information is acquired, and
   a signal for image formation is acquired from the first pixel set and the second pixel set.

2. The image pickup apparatus according to claim 1, wherein the first pixel set and the second pixel set are disposed inside the image pickup element for image formation.

3. The image pickup apparatus according to claim 1, wherein
   the first pupil area and the second pupil area lie at least in a divided area having a center of gravity of area, and two divided areas which are adjacent to the divided area having the center of gravity of area, and
   the first pupil area and the second pupil area have an overlapping portion in the adjacent area.

4. The image pickup apparatus according to claim 1, wherein
   the two straight lines are a straight line in a direction horizontal to one side of the image pickup element, and a straight line in a direction perpendicular to one side of the image pickup element.

5. The image pickup apparatus according to claim 1, further comprising:
   a light shielding unit which is disposed to be opposed to the image pickup element, wherein
   the light shielding unit shields a light beam near an upper left side in each pixel which forms the first pixel set, and
   the light shielding unit shields a light beam near a lower right side in each pixel which forms the second pixel set.

6. The image pickup apparatus according to claim 1, further comprising:
   a light shielding unit which is disposed to be opposed to the image pickup element, wherein
   the light shielding unit shields a light beam near a lower left side in each pixel which forms the first pixel set, and
   the light shielding unit shields a light beam near an upper right side in each pixel which forms the second pixel set.

7. The image pickup apparatus according to claim 1, further comprising:
   a light attenuating unit which is disposed to be opposed to the image pickup element, wherein
   the light attenuating unit attenuates a light beam near an upper left side in each pixel which forms the first pixel set, and
   the light attenuating unit attenuates a light beam near a lower right side in each pixel which forms the second pixel set.

8. The image pickup apparatus according to claim 1, further comprising:
   a light attenuating unit which is disposed to be opposed to the image pickup element, wherein
   the light attenuating unit attenuates a light beam near a lower left side in each pixel which forms the first pixel set, and
   the light attenuating unit attenuates a light beam near an upper right side in each pixel which forms the second pixel set.

9. The image pickup apparatus according to claim 1, wherein
- the pixels of the first pixel set are arranged to correspond to all of the colors of the color filter and include a photoelectric conversion area which receives the light beam from the first pupil area to carry out photoelectric conversion,
- the pixels of the second pixel set are arranged to correspond to all of the colors of the color filter and include a photoelectric conversion area which receives the light beam having the center of gravity of the second pupil area to carry out photoelectric conversion, and
- the photoelectric conversion area of the first pixel set and the photoelectric conversion area of the second pixel set have a same area.

* * * * *